(12) United States Patent
Chow et al.

(10) Patent No.: US 11,489,103 B2
(45) Date of Patent: Nov. 1, 2022

(54) FABRICATING TRANSMON QUBIT FLIP-CHIP STRUCTURES FOR QUANTUM COMPUTING DEVICES

(71) Applicant: International Business Machines Corporation, Armonk, NY (US)

(72) Inventors: Jerry M. Chow, White Plains, NY (US); Sami Rosenblatt, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/128,321

(22) Filed: Dec. 21, 2020

(65) Prior Publication Data

US 2021/0111329 A1 Apr. 15, 2021

Related U.S. Application Data

(63) Continuation of application No. 16/445,764, filed on Jun. 19, 2019, now Pat. No. 10,944,039.

(51) Int. Cl.
*H01L 39/22* (2006.01)
*G06N 10/00* (2022.01)
*H01L 27/18* (2006.01)
*H01L 39/04* (2006.01)
*H05K 1/11* (2006.01)

(52) U.S. Cl.
CPC ........... *H01L 39/223* (2013.01); *G06N 10/00* (2019.01); *H01L 27/18* (2013.01); *H01L 39/045* (2013.01); *H01L 39/221* (2013.01); *H05K 1/112* (2013.01)

(58) Field of Classification Search
CPC ..... H01L 39/223; H01L 27/18; H01L 39/045; H01L 39/221; H01L 39/24; H01L 39/2493; H01L 39/025; G06N 10/00; H05K 1/112; G01R 33/0354; Y10S 977/933; Y10S 505/846
USPC .................. 505/162, 210; 257/34; 326/1, 5; 327/528; 331/107 S
See application file for complete search history.

(56) References Cited

U.S. PATENT DOCUMENTS

2017/0373044 A1* 12/2017 Das .......................... H01L 25/50
2018/0013052 A1* 1/2018 Oliver .................... G06N 10/00

OTHER PUBLICATIONS

List of all IBM related dockets, 2020.
P0037444AU, Application No. 2020296882, Examination report No. 1 for standard patent application, dated Sep. 16, 2022.

\* cited by examiner

*Primary Examiner* — Jonathan Han
(74) *Attorney, Agent, or Firm* — Garg Law Firm, PLLC; Rakesh Garg; Erik Johnson

(57) ABSTRACT

A quantum computing device is formed using a first chip and a second chip, the first chip having a first substrate, a first set of pads, and a set of Josephson junctions disposed on the first substrate. The second chip has a second substrate, a second set of pads disposed on the second substrate opposite the first set of pads, and a second layer formed on a subset of the second set of pads. The second layer is configured to bond the first chip and the second chip. The subset of the second set of pads corresponds to a subset of the set of Josephson junctions selected to avoid frequency collision between qubits in a set of qubits. A qubit is formed using a Josephson junction from the subset of Josephson junctions and another Josephson junction not in the subset being rendered unusable for forming qubits.

25 Claims, 20 Drawing Sheets

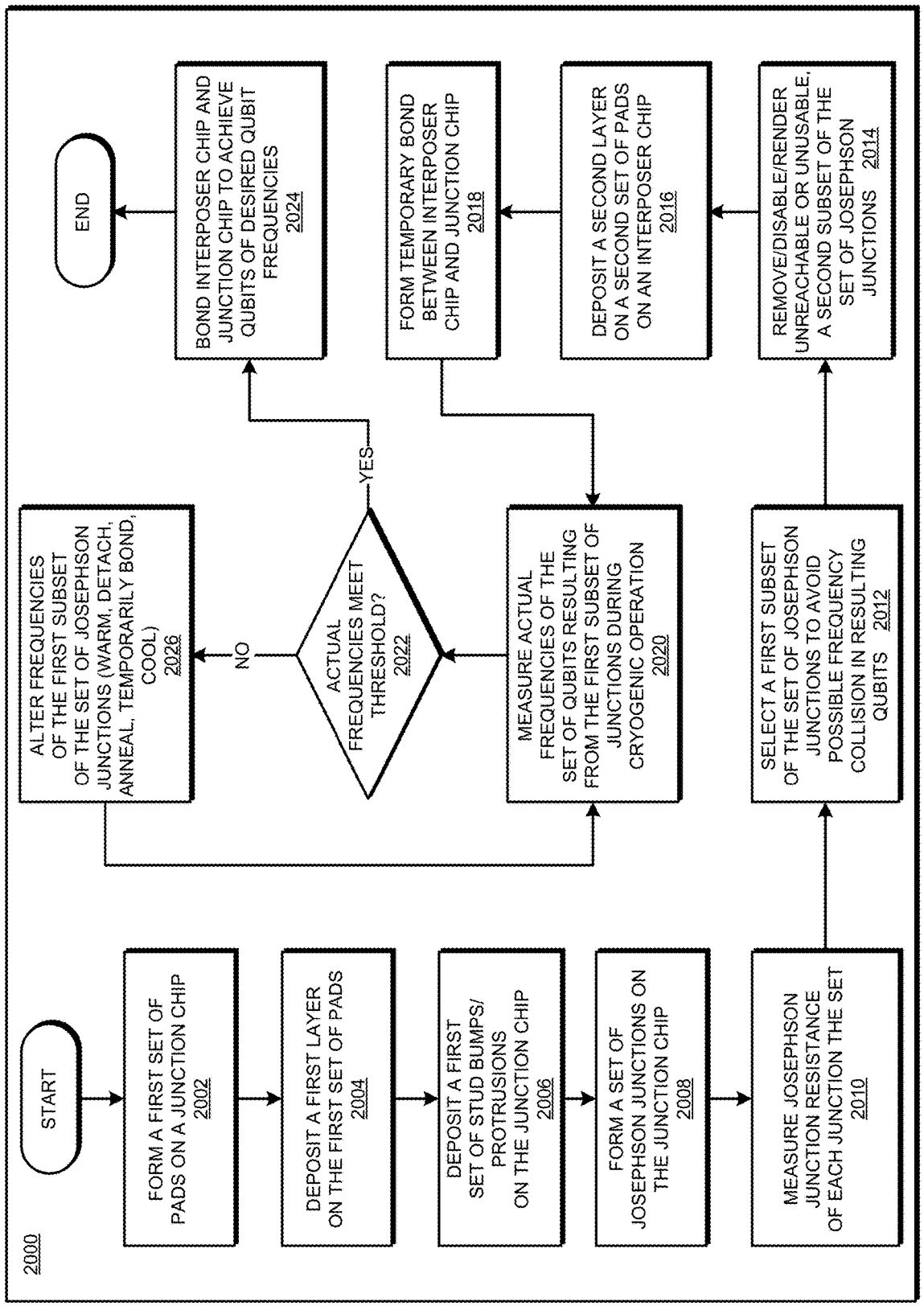

FABRICATING TRANSMON QUBIT FLIP-CHIP STRUCTURES FOR QUANTUM COMPUTING DEVICES

TECHNICAL FIELD

The present invention relates generally to a superconductor device, a fabrication method, and fabrication system for superconducting quantum devices. More particularly, the present invention relates to a device, method, and system for fabricating transmon qubit flip-chip structures for quantum computing devices.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction (Josephson junction). A Josephson junction is a superconducting tunnel junction, which is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. Other methods of forming Josephson junctions exist and this description is not meant to be limiting. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

In a superconducting state, the material firstly offers no resistance to the passage of electrical current. When resistance falls to zero, a current can circulate inside the material without any dissipation of energy. Secondly, the material exhibits the Meissner effect, i.e., provided they are sufficiently weak, external magnetic fields do not penetrate the superconductor, but remain at its surface. When one or both of these properties are no longer exhibited by the material, the material is said to be in a normal state and no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—$|0\rangle$ and $|1\rangle$. These two states may be two energy states of atoms, for example, the ground ($|g\rangle$) and first excited ($|e\rangle$) state of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

The software tools used for designing semiconducting and superconducting devices produce, manipulate, or otherwise work with an electrical layout and device components on very small scales. Some of the components that such a tool may manipulate may only measure few nanometers across when formed in a suitable substrate.

A layout includes shapes whose shape and position is selected in the tool according to the device's objective. Once a design layout, also referred to simply as a layout, has been finalized for a device or a group of devices, the design is converted into a set of masks or reticles. A set of masks or reticles is one or more masks or reticles. During manufacture, a semiconductor wafer is exposed to light or radiation through a mask to form microscopic components comprising the structures. This process is known as photolithography. A mask is usable for manufacturing or printing the contents of the mask onto the wafer. During the photolithographic printing process, radiation is focused through the mask and at certain desired intensity of the radiation. This intensity of the radiation combined with any materials that are deposited using the radiation is commonly referred to as "dose". The focus and the dosing of the radiation is controlled to achieve the desired shape and electrical characteristics of structures on the wafer.

A Fabrication process for a semiconducting or superconducting device includes not only dosing but other methods of depositing and/or removing materials having various electrical and/or mechanical characteristics. For example, a conducting material may be deposited using an beam of ions of that material; a hard insulator may be dissolved using a chemical or eroded using mechanical planning. These examples of operations in a fabrication process are not intended to be limiting. From this disclosure, those of ordinary skill in the art will be able to conceive many other operations in a fabrication process that is usable to fabricate a device according to the illustrative embodiments, and the same are contemplated within the scope of the illustrative embodiments.

Superconducting devices are often planar, i.e., where the superconductor structures are fabricated on one plane. A non-planar device is a three-dimensional (3D) device where some of the structures are formed above or below a given plane of fabrication.

Some qubits are fabricated using a flip-chip geometry. In the flip-chip geometry, a qubit chip (also referred to as a "Qchip") is fabricated having a number of individual qubits upon a substrate, and an interposer chip having one or more connections is fabricated on a separate substrate. Solder bumps are deposited onto chip pads on a first surface of the qubit chip and/or interposer chip, and the qubit chip or interposer chip is flipped over so that its first side faces down. The qubit chip and interposer chip are aligned and bump-bonded, so that the solder of the solder bumps complete the electrical connection of the qubit chip and the interposer chip.

According to the illustrative embodiments described herein, a flip-chip geometry can combine an interposer chip with other chips containing components of qubits but not the complete qubit. For example, a junction chip (also referred to as a "J-chip") is a chip according to the illustrative embodiments that has a plurality of individual Josephson junctions fabricated thereon. A Josephson junction from the plurality is usable to form a qubit when an interposer is combined with the J-chip in a flip-chip configuration in a manner described herein. According to the illustrative embodiments, an interposer chip having one or more connections is fabricated on a separate substrate. Bumps of a suitable material, such as soldering material with the desired electrical, thermal, ductility, and malleability properties in cryogenic and other operating conditions as described herein, are deposited onto chip pads on a first surface of the J-chip and/or interposer chip. Generally, any reference to a solder bump should be construed to include bumps made of material that satisfy these requirements. The J-chip or the interposer chip is flipped over so that a first side of the flipped chip faces towards a first face of the non-flipped chip from the two chips. The J-chip and interposer chip are aligned and bump-bonded, so that the material of a bump completes an electrical connection between the J-chip and the interposer chip.

The readout circuitry is generally coupled with a qubit by electromagnetic resonance (usually a microwave or radio-frequency resonance) using a resonator. A resonator in the readout circuitry comprises inductive and capacitive elements. Some qubits are fixed-frequency qubits, i.e., their resonance frequencies are not changeable. Other qubits are frequency-tunable qubits. A q-processor can employ fixed-frequency qubits, frequency-tunable qubits, or a combination thereof.

The illustrative embodiments recognize that a fixed-frequency qubit is designed to be fixed in frequency to improve immunity to noise. The illustrative embodiments recognize that when the resonance frequencies of two coupled qubits on a chip are the same or within a threshold band of frequencies, or their higher transition frequencies are on resonance or close to resonance, then negative effects can happen such as, crosstalk, quantum decoherence, energy decay, creation of mixed states, unintended information transfer, quantum state leakage and so on. The illustrative embodiments further recognize that such qubits can also negatively affect the performance or utility of certain quantum gates, such as cross-resonance gates which have stringent requirements on the spectrum of resonance frequencies of qubits upon which the gate is operating on. The illustrative embodiments further recognize that one challenge in quantum processors that are based on fixed-frequency qubits is frequency crowding or frequency collision between adjacent qubits.

The illustrative embodiments recognize that another challenge in quantum processors that are based on fixed-frequency qubits is low On/Off ratios between when microwave signals turn On an interaction (On interaction strength) and the interactions between coupled qubits when these signals are disabled (Off interaction strength). The illustrative embodiments further recognize that yet another challenge in quantum processors that are based on fixed-frequency qubits is enabling a gate of interest without producing unwanted interactions at other sites. The illustrative embodiments further recognize that imperfections in the fabrication and the materials used in the presently available fabrication methods for fixed-frequency qubits leads to deviations from an intended resonance frequency.

The illustrative embodiments further recognize that in some cases, a Josephson junction of a qubit can be tuned to adjust a resonance frequency of the qubit. However, the illustrative embodiments recognize that once a flip-chip assembly has been formed, a Josephson junction on the qubit chip or J-chip becomes physically inaccessible for operations such as laser annealing, by which the impedance of the Josephson junction can be modified or tuned. In such a case, the flip-chip assembly becomes fixed with a qubit configuration in which a Josephson junction has an undesirable impedance. Therefore, the illustrative embodiments recognize that a flip-chip configuration is needed in which a qubit can be formed with the desired resonance frequency even after the interposer has been flipped over the J-chip.

SUMMARY

The illustrative embodiments provide a method and system of fabrication for a quantum computing device. The embodiment forms a first chip having a first substrate, a first set of pads, and a set of Josephson junctions disposed on the first substrate. The embodiment further forms a second chip having a second substrate, a second set of pads disposed on the second substrate opposite the first set of pads, and a second layer formed on a subset of the second set of pads, the second layer configured to bond the first chip and the second chip, wherein the subset of the second set of pads corresponds to a subset of the set of Josephson junctions selected to avoid frequency collision between qubits in a set of qubits, a qubit in the set of qubits resulting from a Josephson junction in the subset of Josephson junctions. Thus, the embodiment provides a quantum computing device in a flip-chip configuration where several Josephson junctions on a J-chip are made with manufacturing variations in properties, and only some Josephson junctions are selected to form qubits with desirable frequency collision avoidance characteristics.

Another embodiment further forms an unusable Josephson junction in the set of Josephson junctions, wherein a first Josephson junction in the set of Josephson junctions is modified to become the unusable Josephson junction responsive to the first Josephson junction being excluded from the subset of the set of Josephson junctions. Thus, the embodiment provides a quantum computing device in a flip-chip configuration where other Josephson junctions on the J-chip are rendered unusable for use in the quantum computing device.

Another embodiment further forms a disconnected pad in the first set of pads, wherein the first set of pads comprises a first pad electrically coupled to the first Josephson junction, and wherein the first pad is electrically disconnected from the first Josephson junction to form the disconnected pad, the disconnected pad rendering the first Josephson junction unusable. Thus, the embodiment provides a hardware change to render Josephson junctions on the J-chip unusable for use in the quantum computing device.

In another embodiment, an electrical property of the first Josephson junction is modified such that the first Josephson junction no longer operates as a Josephson junction. Thus, the embodiment provides another hardware change to render Josephson junctions on the J-chip unusable for use in the quantum computing device.

In another embodiment, the subset is selected based upon a measurement of a parameter associated with each of the set of Josephson junctions. Thus, the embodiment provides a property of Josephson junctions on the J-chip based on which the junction can be selected for use in the quantum computing device.

In another embodiment, the resonance frequency associated with a particular qubit is one member selected from a set of (i) a predicted resonance frequency calculated based upon the measured parameter, and (ii) an actual measured resonance frequency of the particular qubit. Thus, the embodiment provides a predicted property of a qubit formed using a Josephson junctions on the J-chip, based on which the junction can be selected for use in the quantum computing device.

In another embodiment, the parameter includes a resistance associated with a Josephson junction in the set of Josephson junctions. Thus, the embodiment provides a specific property of Josephson junctions on the J-chip based on which the junction can be selected for use in the quantum computing device.

In another embodiment, the resistance is a normal-state resistance of the Josephson junction. Thus, the embodiment provides a specific property of Josephson junctions on the J-chip based on which the junction can be selected for use in the quantum computing device.

Another embodiment further forms a first set of protrusions formed on the first chip. The embodiment further includes a set of bumps formed on the first layer of the second chip, the set of bumps formed of a material having above a threshold ductility at a room temperature range, wherein set of bumps are configured to cold weld to the first set of protrusions. Thus, the embodiment provides an apparatus for detachably configuring the two chips in the flip-chip configuration.

In another embodiment, the first set of protrusions is of at least one member selected from a set comprising Gold and Platinum. Thus, the embodiment provides a material for an apparatus for detachably configuring the two chips in the flip-chip configuration.

In another embodiment, the set of bumps is of at least one member selected from a set comprising Indium, Tin, Lead, and Bismuth. Thus, the embodiment provides an apparatus for bonding configuring the two chips in the flip-chip configuration.

Another embodiment further forms a flip-chip assembly comprising the first chip detachably attached to the second chip using the cold weld, wherein a parameter of a Josephson junction inside the flip-chip assembly is tunable by disassembling the flip-chip assembly at the cold weld. Thus, the embodiment provides for a detachable configuration of the two chips in the flip-chip configuration or adjusting a property of a Josephson junction.

An embodiment includes a fabrication system for fabricating the quantum computing device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 20 depicts a flowchart of an example process for fabricating a flip-chip quantum computing device in accordance with an illustrative embodiment.

DETAILED DESCRIPTION

The illustrative embodiments used to describe the invention generally address and solve the above-described problems or needs and other related problems or needs by providing a fabrication method for fabricating transmon qubit flip-chip structures that are usable in flip-chip quantum computing devices. The illustrative embodiments also provide a system for fabricating the transmon qubit flip-chip structures for flip-chip quantum computing devices.

Figure 1:
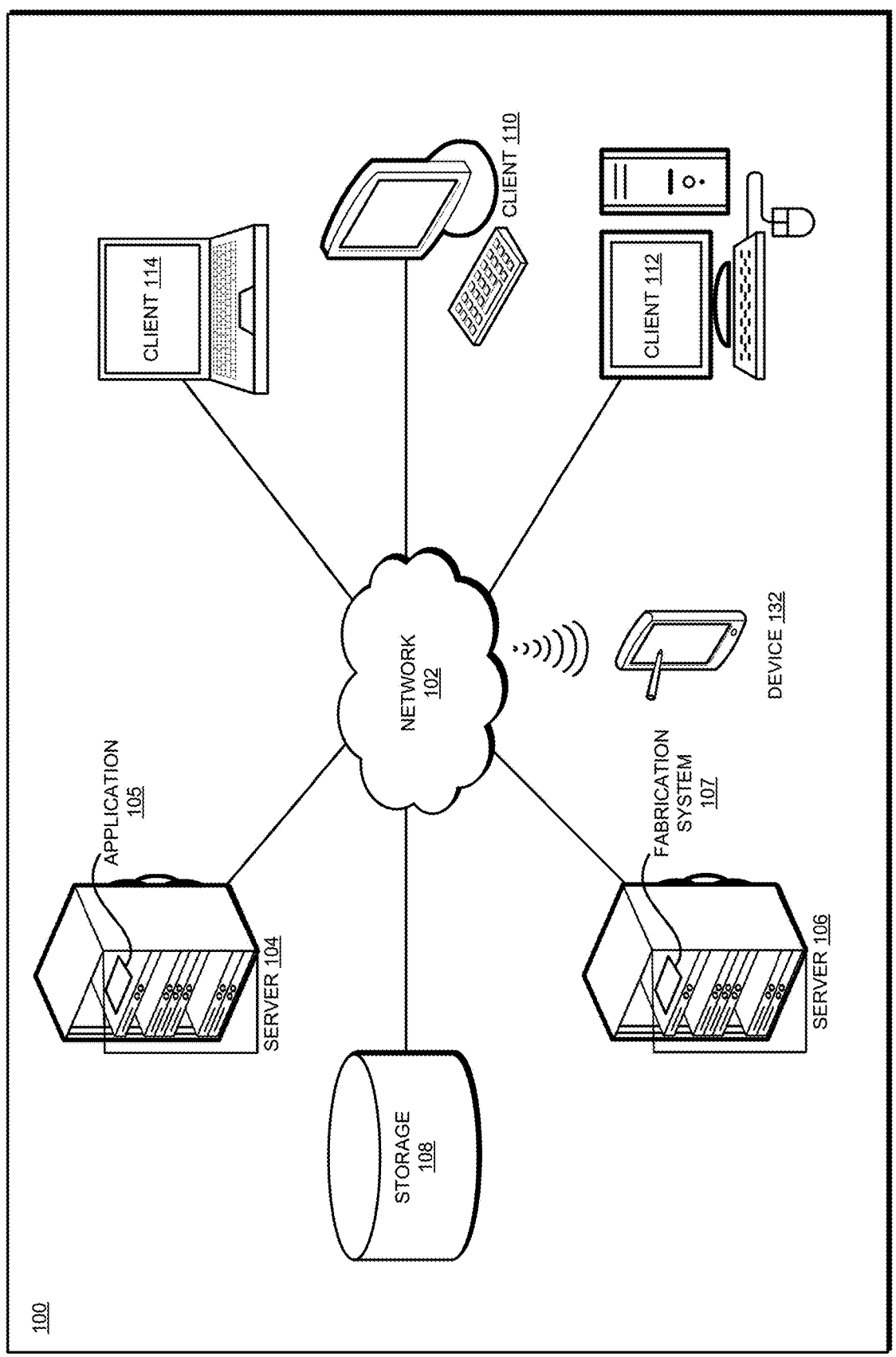
FIG. 1 depicts a block diagram of a network of data processing systems in which illustrative embodiments may be implemented.

With reference to the figures and in particular with reference to FIG. 1, these figures are example diagrams of data processing environments in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is a software component of any suitable system for fabricating a quantum device, such as a Josephson junction, a qubit, and other superconducting structures used in quantum computing devices. Generally, fabrication systems and their corresponding software components for manufacturing superconducting devices, including devices for quantum computing usage, are known. Application 105 provides instructions to such a known fabrication system via fabrication application 107 for causing the assembly of a novel flip-chip quantum device contemplated in the illustrative embodiments, in a manner described herein.

Figure 2:
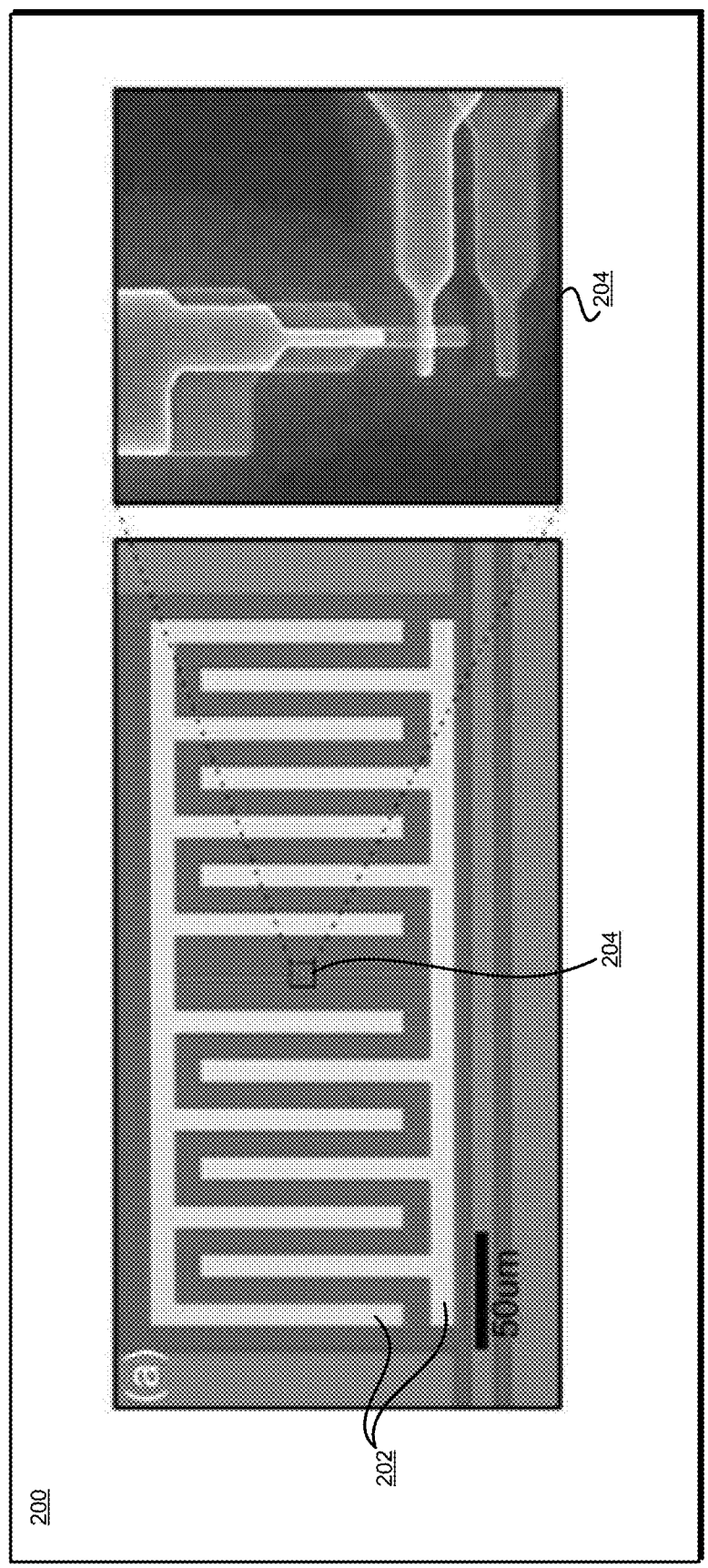
FIG. 2 depicts a qubit for use in a quantum processor.

With reference to FIG. 2, this figure depicts a qubit for use in a quantum processor. Qubit 200 includes capacitor structure 202 and Josephson junction 204. Josephson junction 204 is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In superconducting qubit 200, Josephson junction 204—which has a small inductance—is electrically coupled in parallel with capacitor structure 202, forming a nonlinear resonator.

Figure 3:
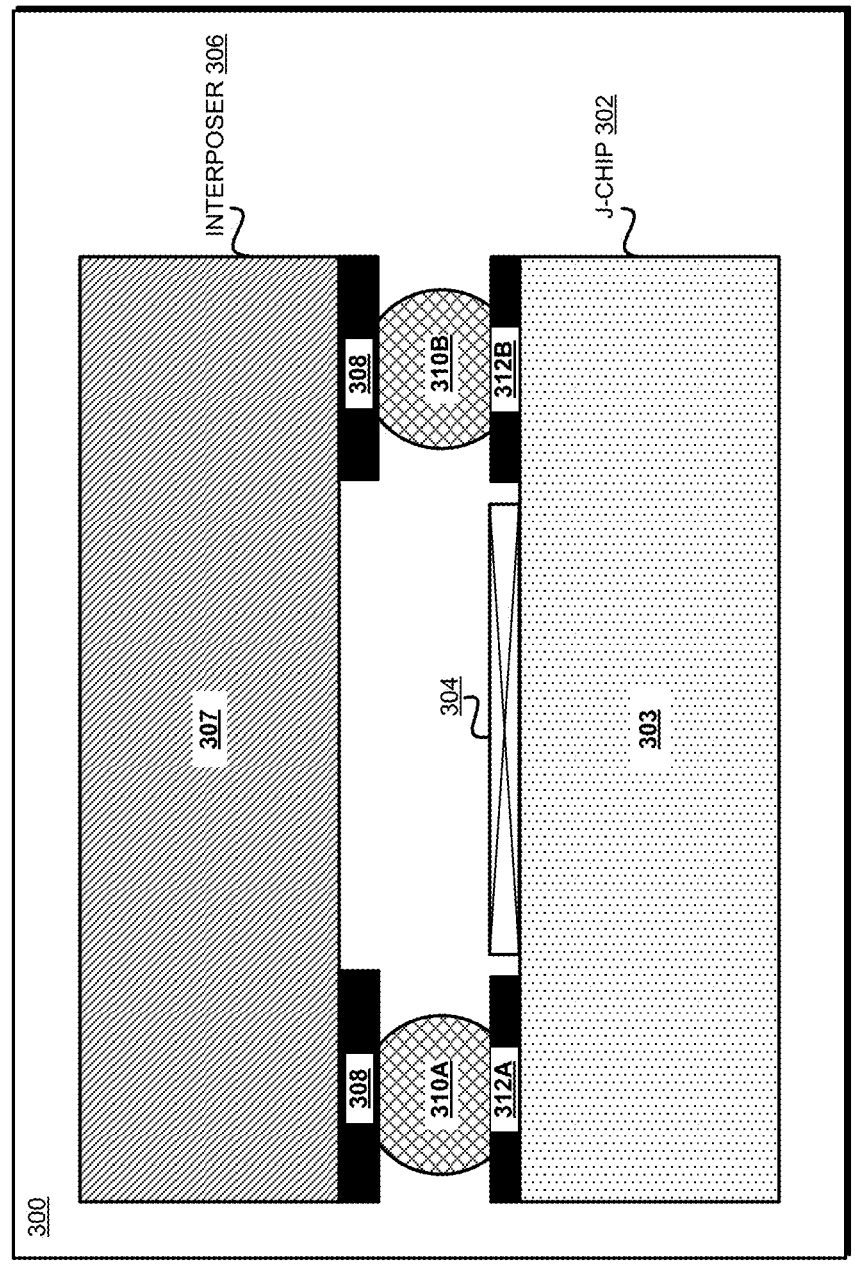
FIG. 3 depicts an example cross-section view of a flip-chip quantum computing device illustrating a problem that can be solved using an illustrative embodiment.

With reference to FIG. 3, this figure depicts an example cross-section view of a flip-chip quantum computing device illustrating a problem that can be solved using an illustrative embodiment. Flip-chip quantum computing device 300 includes a J-chip 302 having a substrate 303. Substrate 303 is selected to be a suitable material on which Josephson junctions can be formed, and eventually the material is suitable for forming qubits using the Josephson junctions. Substrate 303 includes Josephson junction 304 formed on a first surface of substrate 303. In the embodiment, Josephson junction 304 has an associated impedance, which contributes in setting a qubit resonance frequency for the qubit in which Josephson junction 304 might be used, as described herein.

Substrate 303 comprises a material, which when operating in a cryogenic temperature range, exhibits a Residual Resistance Ratio (RRR) of at least 100, and a thermal conductivity of greater than a 1 W/(cm*K) at 4 Kelvin. RRR is the ratio of the resistivity of a material at room temperature and at 0 K. Because 0 K cannot be reached in practice, an approximation at 4 K is used. For example, substrate 303 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming substrate 303 and the same are contemplated within the scope of the illustrative embodiments.

Flip-chip quantum computing device 300 further includes an interposer chip 306 including an interposer substrate 307. Interposer substrate 307 comprises a material that exhibits an RRR of at least 100, and a thermal conductivity of greater than a 1 W/(cm*K) at 4 Kelvin. For example, interposer substrate 307 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming substrate 307 and the same are contemplated within the scope of the illustrative embodiments. In a particular embodiment, one or more of substrate 303 and interposer substrate 307 are formed of silicon or another suitable substrate material.

Interposer chip 306 includes a conventional ground plane 308 formed on the first surface of interposer substrate 307. In a particular embodiment, ground plane 308 is formed of a superconductive material, multiple superconductive materials, a metal material, or a combination thereof.

J-chip 302 includes first landing pad 312A and second landing pad 312B formed on the first surface of substrate 303. First landing pad 312A and second landing pad 312B are parts of a ground plane (not shown) on J-chip 302. In a particular embodiment, landing pads 312A-B are formed of a superconductive material, multiple superconductive materials, a metal material, or a combination thereof.

Ground plane 308 of interposer chip 306 is bonded to J-chip 302 by first bump bond 310A and second bump bond 310B. In some embodiments, a single bump bond, or more than two bump bonds may also be used to bond ground plane 308 of interposer 306 with J-chip 302. In such embodiments, J-chip 302 can be formed with a suitable number of landing pads to enable a desired number of ground plane bonds.

Bonding forms an electrical connection between interposer chip 306 and J-chip 302 through first bump bond 310A and first landing pad 312A, and through second bump bond 310B and second landing pad 312B. In an embodiment, ground plane 308, first landing pad 312A, and second landing pad 312B are formed using at least one of Aluminum, Niobium, Titanium, Titanium Nitride, Palladium, Gold, Silver, Copper, or Platinum for operations in the temperature range of 77 K to 0.01K. In an embodiment, bump bonds 310A, 310B are formed using Indium, Tin, and alloys of Bismuth for operations in the temperature range of 77 K to 0.01K. These examples of ground plane, bump bond materials and landing pad materials are not intended to be limiting. From this disclosure those of ordinary skill in the art will be able to conceive of many other materials suitable for forming the first layer and the same are contemplated within the scope of the illustrative embodiments.

Qubit resonance frequency is difficult to control due to variations in Josephson junction inductance during fabrication. Josephson junctions made by shadow evaporation, e.g., by a Dolan bridge technique, naturally show variations in their Josephson inductance. For identically designed and fabricated/processed single junction transmon qubits, each qubit may naturally have a different resonant frequency (e.g., with a variation of 100 MHz-200 MHz). Such conditions may lead to frequency collisions for fixed frequency qubits using cross-resonance entangling gates such as frequency collisions between a qubit that uses Josephson junction 304 and a second, coupled qubit, which uses another Josephson junction on J-chip 302.

The illustrative embodiments recognize that preventing frequency collisions is a challenging issue for fixed frequency superconducting qubits, and changing or modifying the qubit frequency after chip fabrication is difficult using conventional methods. The frequency of a qubit is inversely proportional to the square root of the product of the Josephson inductance and the total capacitance across the Josephson junction. Accordingly, approaches to address frequency collisions include changing the single-junction transmon qubit frequency by modifying the junction inductance or the total capacitance across (e.g., in parallel with) the junction.

Several approaches have been proposed to adjust the junction inductance in order to adjust the resonance frequency, but each have limitations and drawbacks. For example, changing the inductance is difficult to perform precisely. Alternately, frequency adjustment can be performed by changing capacitance, for example, by etching the substrate (e.g., a silicon (Si) substrate) in the gap of a planar capacitor to change the effective dielectric constant. However, such etching exposes the Josephson junction to significantly more fabrication processes. In addition, etching and related processing can introduce additional loss mechanisms. Further, etching and related processing can typically only be used to decrease capacitance and increase qubit frequency, but not to increase capacitance and correspondingly decrease qubit frequency.

An embodiment provides for a a flip-chip geometry including a J-chip and an interposer chip, which is usable to form a qubit in a quantum processor. The J-chip includes a plurality of Josephson junctions defined on a substrate.

An embodiment provides for a novel design and fabrication method of a quantum computing device in a flip-chip geometry. In the embodiment, a design/fabrication system designs and fabricates a J-chip having a plurality of Josephson junctions using known processes for fabricating a Josephson junction. The design/fabrication system further designs and fabricates an interposer chip.

Each fabricated Josephson junction has normal-state resistance, which can be measured, for example, by electrically probing the Josephson junction resistance above the superconducting transition temperature. A resonance frequency of a qubit that uses a particular Josephson junction can be predicted based upon the measured Josephson junction resistance of that particular Josephson junction. A particular embodiment uses a fitted curve relating Josephson junction resistance to frequency to calculate the predicted frequency of such a qubit. Although various embodiments describe measurement of a resistance of a Josephson junction, in other embodiments measurement of an impedance or inductance of the Josephson junction, may be used to predict the resonance frequency of a qubit that uses the Josephson junction.

In an embodiment, the design/fabrication system determines possible frequency collisions based upon the predicted resonance frequency resulting from a set of more than one Josephson junctions fabricated on J-chip 302. Specifically, the embodiment determines the predicted resonance frequency of a possible qubit that might use a Josephson junction from the set of Josephson junctions. From the set of possible qubits, the embodiment determines a first subset of possible qubits (which use a corresponding first subset of Josephson junctions from the set of Josephson junctions), which satisfy a frequency collision separation threshold. Correspondingly and optionally, from the set of possible qubits, the embodiment determines a second subset of possible qubits (which use a corresponding second subset of Josephson junctions from the set of Josephson junctions), which fail to satisfy the frequency collision separation threshold.

In an embodiment, where the qubit resonance frequencies are a function of a separation gap distance between the interposer chip and the J-chip, the design/fabrication system also determines a suitable separation gap distance between the interposer chip and the J-chip based upon the desired frequency adjustment, frequency tuning range, and sensitivity, which would result in an acceptable numerosity of qubits in the first subset. In the embodiment, the design/fabrication system bonds the interposer chip and J-chip at the separation gap distance to achieve the desired qubit frequencies and qubit numerosity in the flip-chip arrangement.

In a particular embodiment, the design/fabrication system bonds the interposer chip and J-chip. In one embodiment, the bonding is performed using a bump bond process. In other particular embodiments, other suitable methods of bonding the interposer chip and the J-chip may be used.

Another embodiment provides a fabrication method for flip-chip quantum computing devices, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of Josephson junctions in a set of Josephson junctions, or a number of qubits using a subset of the set of Josephson junctions, arranged on a substrate. An embodiment can be implemented with a different number of Josephson junctions in the set of Josephson junctions, different number of Josephson junctions in the subset to form qubits, different arrangements, a superconducting device other than a qubit formed using a Josephson junction in the subset, types of quantum computing devices not based on cryogenic superconductors, or some combination thereof, within the scope of the illustrative embodiments.

Furthermore, a simplified diagram of the example flip-chip geometry is used in the figures and the illustrative embodiments. In an actual fabrication of a flip-chip, additional structures that are not shown or described herein, or structures different from those shown and described herein, may be present without departing the scope of the illustrative embodiments. Similarly, within the scope of the illustrative embodiments, a shown or described structure in the example flip-chip may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, numerosity, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit that is presently viable, only as an example. The steps described by the various illustrative embodiments can be adapted for fabricating a variety of quantum computing devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, thermal properties, structures, formations, shapes, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

An advantage that may be provided by an embodiment is that there is no need for additional processes on the J-chip after fabrication which provides for no risk of junction damage or failure.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 4:
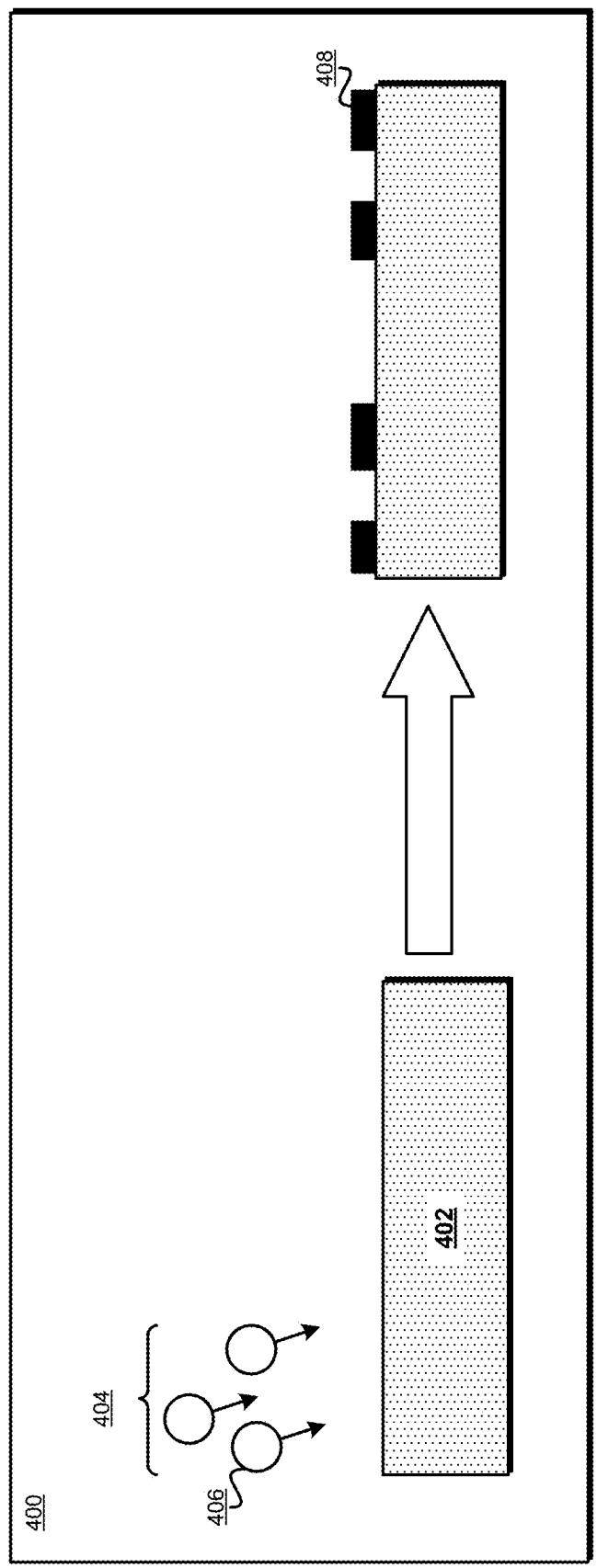
FIG. 4 depicts a block diagram of an example J-chip configuration in accordance with an illustrative embodiment.

With reference to FIG. 4, this figure depicts a block diagram of an example J-chip configuration in accordance with an illustrative embodiment. Application 105 in FIG. 1 interacts with fabrication system 107 to produce or manipulate configuration 400 as described herein. Substrate 402 is an example of substrate 302 in FIG. 3.

An embodiment causes the fabrication system to deposit material 404, thus forming a set of pads 408. For example, a mask can be designed to include the layout of one or more pads 408. The fabrication system operating in conjunction with an embodiment uses the mask to pattern material 404 in the shape of pads 408 on (or in) substrate 402 via the photolithographic process described earlier. A pattern corresponding to pads 408 etched in a hard mask layer can also allow a photolithographic process to deposit material 404 in the shape of pads 408. These and other possible manners of forming pads 408 via lithographic processes are contemplated within the scope of the illustrative embodiments.

Set of pads 408 comprises material 404 with high electrical and thermal conductivity (above a threshold RRR and above a threshold thermal conductivity) in the cryogenic temperature range. In an embodiment, set of pads 408 are formed using at least one of Aluminum, Niobium, Titanium, Titanium Nitride, Palladium, Gold, Silver, Copper, or Platinum for operations in the temperature range of 77 K to 0.01K. These examples of layer materials are not intended to be limiting. From this disclosure, those of ordinary skill in the art will be able to conceive of many other materials suitable for forming the set of pads and the same are contemplated within the scope of the illustrative embodiments.

In an embodiment, set of pads 408 is deposited on one side, e.g. a side of substrate 402 that will face the interposer in the flip-chip configuration. For example, set of pads 408 can be a thin film deposition of particles 406 on substrate 402. Particles 406 can be deposited using a thin film deposition technique in lithography. This example of a deposition method is not intended to be limiting. From this disclosure, those of ordinary skill in the art will be able to conceive of many other methods and process suitable for forming the set of pads and the same are contemplated within the scope of the illustrative embodiments. In an embodiment, particles 406 are of a material that is usable for electrically isolating an Under Bump Metal (UBM) layer (described at least in FIG. 5) from substrate 402. In one embodiment, pads 408 are optional, e.g., when the substrate or an underlying structure, e.g., a ground plane formed in some other manner, has a required electrical characteristic for fabricating a UBM layer atop such structure, the UBM layer can be formed to a desired height directly on the substrate or the underlying structure.

Figure 5:
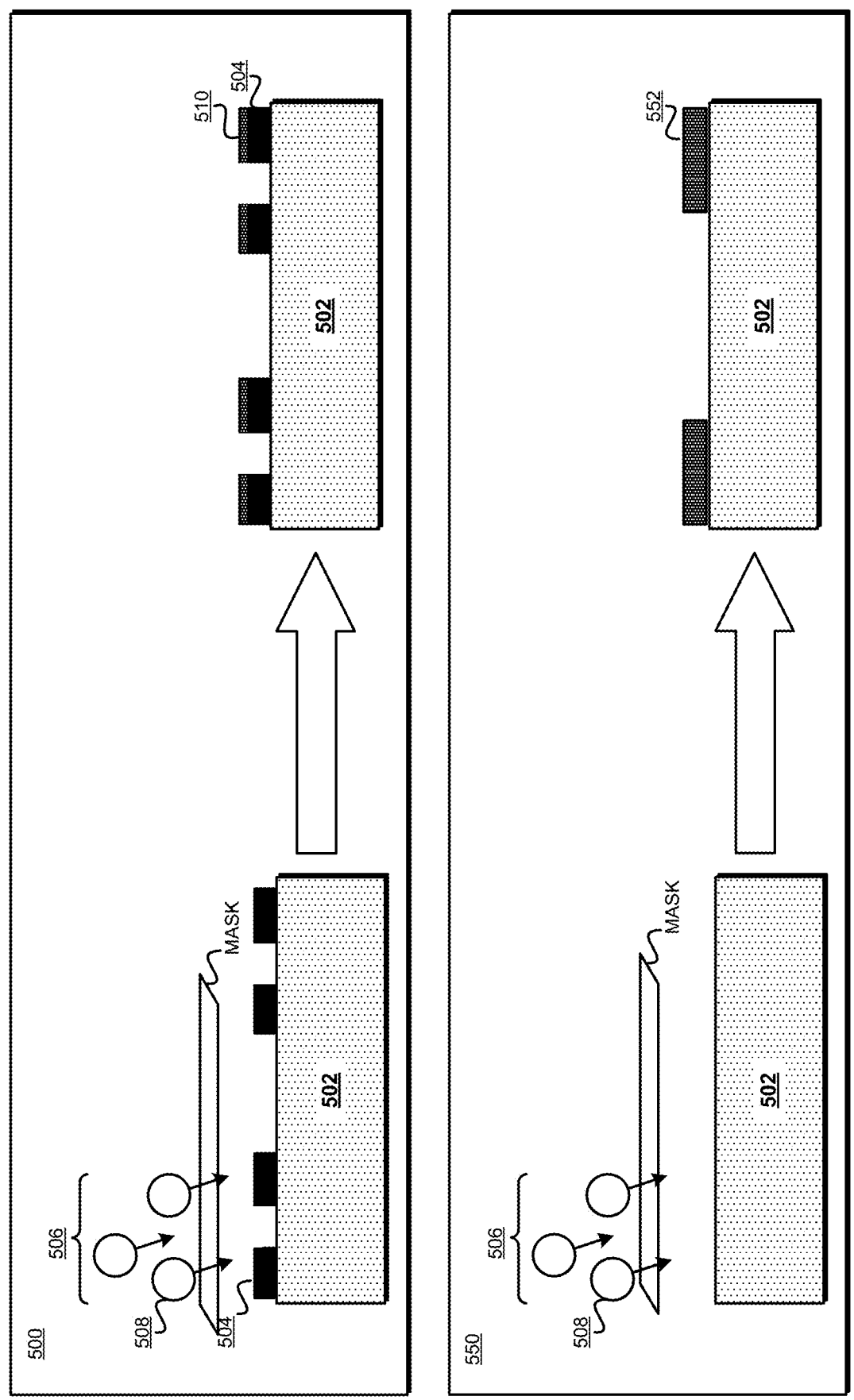
FIG. 5 depicts a block diagram of an example configuration reached in the fabrication of the flip-chip device in accordance with an illustrative embodiment.

With reference to FIG. 5, this figure depicts a block diagram of an example configuration reached in the fabrication of the flip-chip device in accordance with an illustrative embodiment. Application 105 in FIG. 1 interacts with fabrication system 107 to produce or manipulate configuration 500 as described herein. Substrate 502 is an example of substrate 402 in FIG. 4, or substrate 302 in FIG. 3. Pads 504 are examples of pads 408 from FIG. 4, and may be optional for the reasons described earlier.

A UBM is a conductive structure which is electrically coupled to a Josephson junction on the J-chip. The material of the UBM allows reliable formation and adhesion of a bump of a suitable conductive material, e.g., a cryogenic superconducting solder bump. Thus, functionally, the UBM operates as a part of the superconducting pathway from a bump to the Josephson junction in cryogenic operating conditions.

Configuration 500 is a configuration that is optionally reachable from configuration 400 in FIG. 4 using a suitably configured mask in a lithographic process. Alternatively, when pads 408 of FIG. 4 are not utilized, configuration 500 is reachable from configuration 300 in FIG. 3, and the UBM structures described in this figure can be formed up to a desired height directly on a substrate or another structure, in a manner described earlier herein, using a suitably configured mask in a lithographic process.

The depiction of the mask and the description of the lithography techniques should not be construed as limiting on the manner of forming the structures described herein. The depicted mask and depicted manner of depositing the material are merely simplified and generalized examples. Lithography of the depicted structures is possible in many ways. For example, lithography of the described structures is presently accomplished by patterning a resist with photolithography (light) or ebeam lithography (electron beam), developing the resist, then either subtracting deposited material from the openings in the resist, or depositing material in the openings in the resist. The resist is removed at the end. Pads, resonators and ground planes are usually made by subtraction, and junctions and UBM are usually made by addition (and subsequent lift off process) using the presently available fabrication facilities. Fabrication processes and technology is constantly changing and other methods of forming the described structures are within the contemplations of the illustrative embodiments so long as the resulting structures have the electrical, mechanical, thermal, and operating characteristics as described herein.

In one embodiment, first layer 510 is patterned using a mask on pad 504 via a lithographic process, e.g., using a depositing method, to form a UBM. In another embodiment, as depicted in configuration 550, first layer 552 is patterned up to a desired height on substrate 502 via a lithographic process to form a UBM in a manner described herein. As a non-limiting example, first layer 510 can be patterned using a thin film deposition technique in lithography to deposit particles 508. As another example, first layer 510 can be patterned using a sputtering technique known in lithography. These examples of methods of forming the UBM are not intended to be limiting. From this disclosure, those of ordinary skill in the art will be able to conceive of many other methods and process suitable for forming the UBM and the same are contemplated within the scope of the illustrative embodiments. Further description using UBM 510 of configuration 500 is only for the clarity of the description and not to imply any limitation on any embodiments. A configuration shown using UBM 510 or an equivalent thereof can be implemented using UBM 552 or an equivalent thereof, without departing the scope of the illustrative embodiments.

Figure 6:
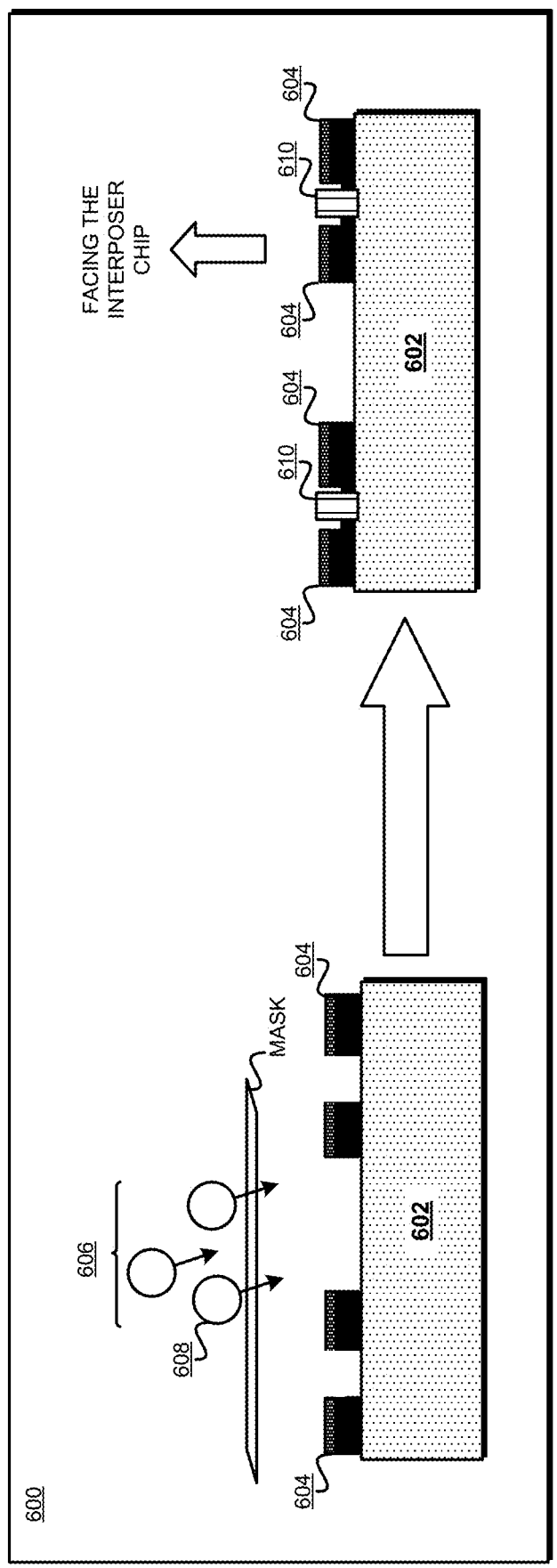
FIG. 6 depicts a block diagram of an example configuration reached in the fabrication of the flip-chip device in accordance with an illustrative embodiment.

With reference to FIG. 6, this figure depicts a block diagram of an example configuration reached in the fabrication of the flip-chip device in accordance with an illustrative embodiment. Application 105 in FIG. 1 interacts with fabrication system 107 to produce or manipulate configuration 600 as described herein. Substrate 602 is an example of substrate 502 in configuration 500 or 550 of FIG. 5. Pads 604 are UBMs, configured in the manner of either a combination of structure 504 and first layer 510, or in the manner of layer 552 in FIG. 5. An embodiment causes a fabrication system, which is configured to fabricate quantum computing devices or components therefor, as described with respect to FIG. 1, to pattern material 606 into Josephson junction 610 on J-chip substrate 602. As one non-limiting example, Josephson junction 610 can be patterned using a suitably designed mask with photolithography.

Figure 7:
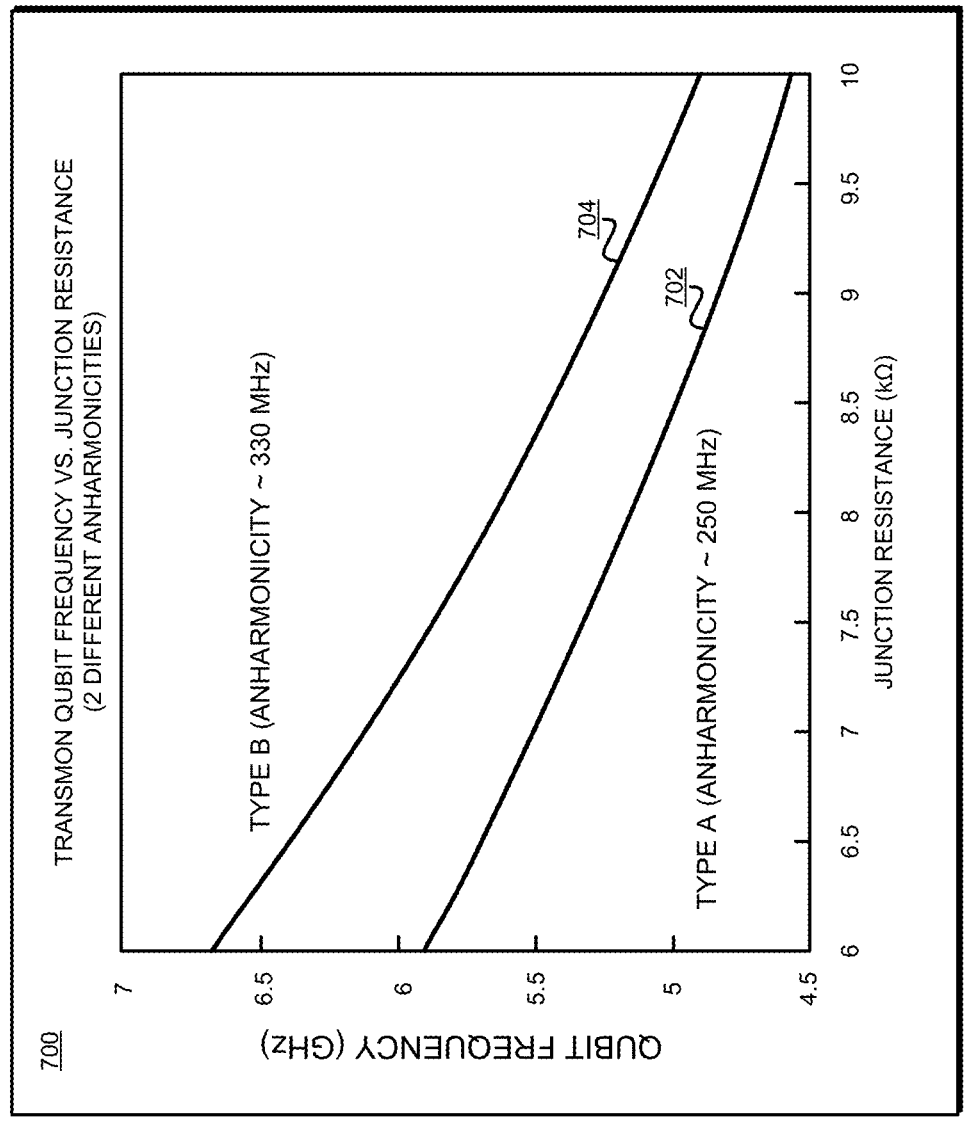
FIG. 7 depicts an example graph for calculating a predicted frequency of a qubit based upon a measured junction resistance in accordance with an illustrative embodiment.

With reference to FIG. 7, this figure depicts an example graph for calculating a predicted frequency of a qubit based upon a measured junction resistance in accordance with an illustrative embodiment. FIG. 7 illustrates a graph of a predicted qubit frequency f01 versus a Josephson junction resistance R. Graph 700 includes curve 702 and curve 704. In accordance with an embodiment, a resistance of the Josephson junction is measured (e.g., by electrical probing) to obtain a resistance R. Based upon the measured resistance R, a predicted resonance frequency of the qubit that uses that Josephson junction may be determined by reading the corresponding value on the Y-axis of curves 702 and 704 in graph 700.

Figure 8:
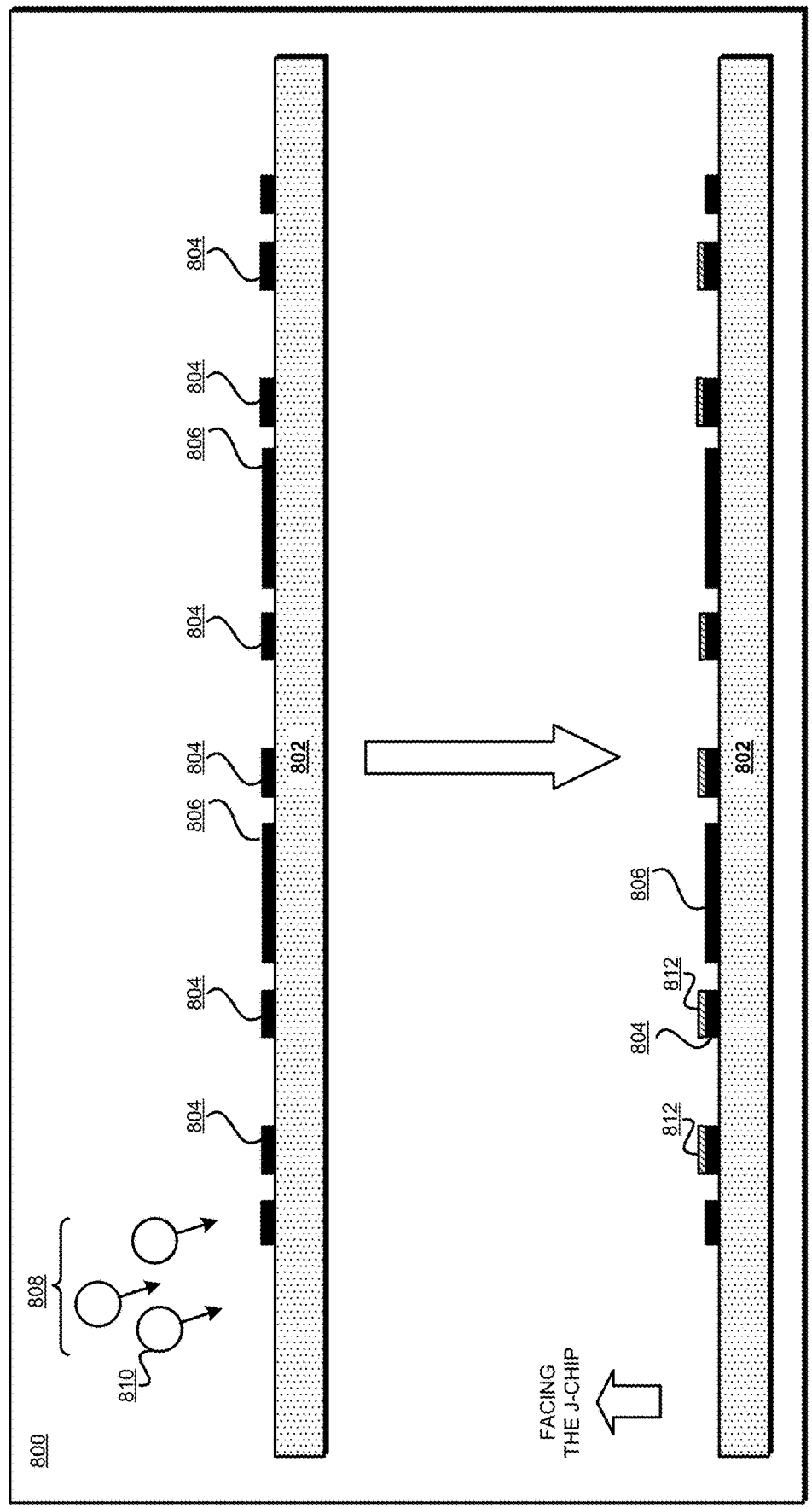
FIG. 8 depicts a block diagram of an example configuration reached in the fabrication of the flip-chip device in accordance with an illustrative embodiment.

With reference to FIG. 8, this figure depicts a block diagram of an example configuration reached in the fabrication of the flip-chip device in accordance with an illustrative embodiment. Application 105 in FIG. 1 interacts with fabrication system 107 to produce or manipulate configuration 800 as described herein. Configuration 800 includes interposer substrate 802, a set of pads 804 formed on a frontside of the interposer substrate 802, and a set of resonator signal lines 806. In one embodiment, pads 804 and resonator signal lines 806 are formed of a material that exhibits similar electro-thermal characteristics as the material of ground plane 308 in FIG. 3. In another embodiment, pads 804 and resonator signal lines 806 are formed of the same material as ground plane 308 in FIG. 3. In one embodiment, pads 804 and resonator signal lines 806 are patterned at the same lithographic step in which ground plane 308 is patterned in FIG. 3. In another embodiment, pads 804 and resonator signal lines 806 are patterned separately and after the lithographic step in which ground plane 308 is patterned in FIG. 3.

An embodiment causes the fabrication system to deposit material 810, patterned for example with a deposition process 808 in photolithography, thus forming a first layer 812 on the set of pads 804. In an embodiment, first layer 812 is patterned using materials and photolithographic processes functionally similar to those used for patterning first layer 510 on pads 504 in FIG. 5. First layer 812 forms a UBM layer over a corresponding pad 804.

Figure 9:
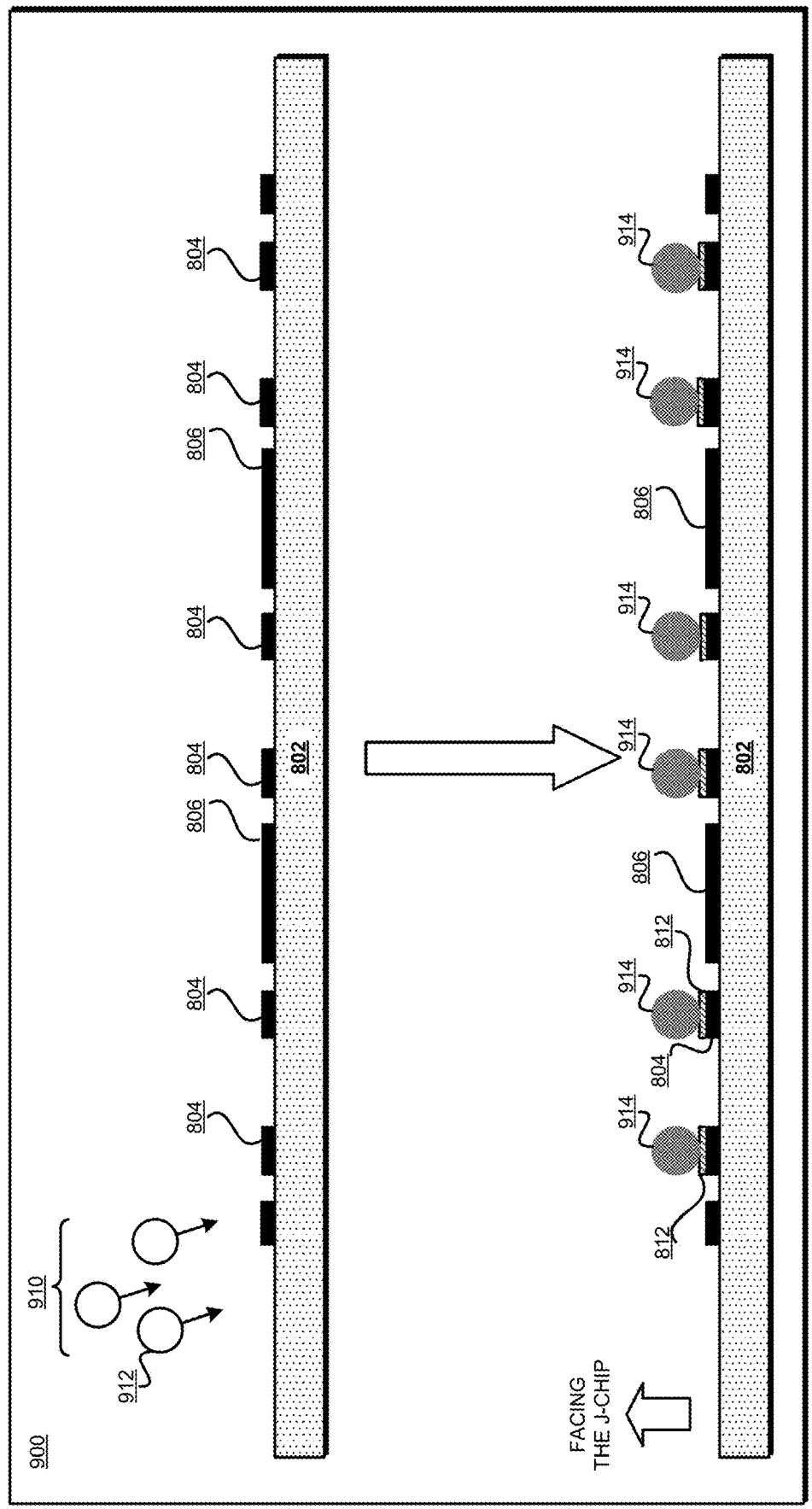
FIG. 9 depicts a block diagram of an example configuration reached in the fabrication of the flip-chip device in accordance with an illustrative embodiment.

With reference to FIG. 9, this figure depicts a block diagram of an example configuration reached in the fabrication of the flip-chip device in accordance with an illustrative embodiment. Application 105 in FIG. 1 interacts with fabrication system 107 to produce or manipulate configuration 900 as described herein. Configuration 900 is further development of configuration 800 in FIG. 8, and reference numerals 802, 804, 806, and 812 are indicative of the same or similar structures as depicted and described with respect to FIG. 8.

An embodiment causes the fabrication system perform a suitable lithography operation 910 to deposit material 912, thus forming a second layer 914 on the first layer 812. In an embodiment, second layer 914 is deposited on first layer 812 only on a subset of the set of pads-UBM structures 804-812. In an embodiment, the subset of the set of pads-UBM structures 804-812 corresponds to a selected subset of the set of Josephson junction. As described herein, not all Josephson junctions in a set of Josephson junctions may satisfy the requirements for forming qubits, and only a subset of Josephson junctions might be selected. The subset of the set of pads-UBM structures 804-812 that correspond to the selected subset of Josephson junctions are the ones that receive second layer 914. In practice, an embodiment causes a lithography mask to be created such that only the selected subset of pads-UBM structures 804-812 receive the deposit of material 912 to form second layer 914. Other methods, such as, but not limited to, hard mask creation instead of lithographic mask, are also possible for a similar purpose and the same are contemplated within the scope of the illustrative embodiments.

In an embodiment, second layer 914 is a set of solder bumps. In an embodiment, an instance of second layer 914 is a bump formed using Indium, Tin, and Bismuth, or some combination thereof, for operations in the temperature range of 77 K to 0.01K. These examples of a second layer material are not intended to be limiting. From this disclosure those of ordinary skill in the art will be able to conceive of many other materials suitable for forming the second layer and the same are contemplated within the scope of the illustrative embodiments.

In an embodiment, second layer 914 is deposited on the first layer 906. For example, second layer 914 is an injection molded soldering (IMS) deposition of particles 912 onto first layer 812. In some implementations, layer 812 may be absent and particles 912 may be deposited onto pad 804 to form bump 914. In some other implementations, pad 804 may be absent and bump 914 may be formed on UBM layer 812. In some other implementations, the pad-UBM layer combination 804-812 may be formed in an alternative manner using alternative materials but for a similar purpose—to enable electrical connectivity to a Josephson junction from a point in the interposer chip. In such a case, bump 914 may be formed at or over the alternative structure without departing the scope of the illustrative embodiments.

Figure 10:
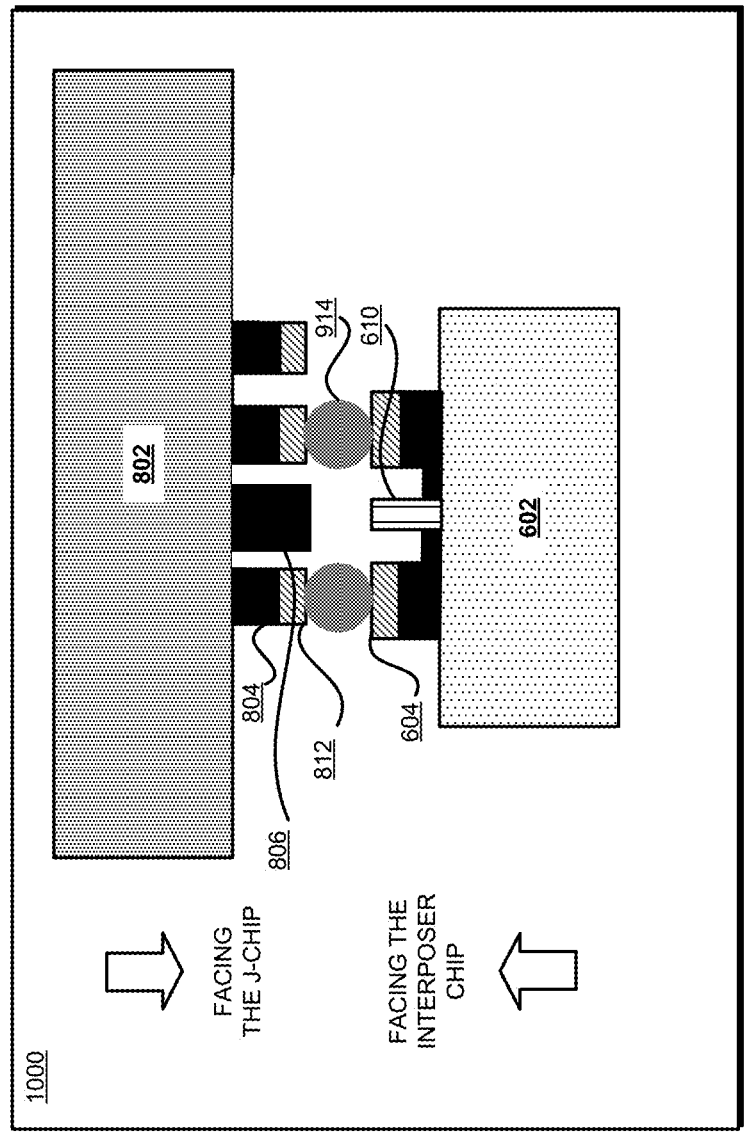
FIG. 10 depicts a block diagram of an example flip chip configuration reached in the fabrication of the flip-chip device in accordance with an illustrative embodiment.

With reference to FIG. 10, this figure depicts a block diagram of an example flip chip configuration reached in the fabrication of the flip-chip device in accordance with an illustrative embodiment. Application 105 in FIG. 1 interacts with fabrication system 107 to produce or manipulate configuration 1000 as described herein.

An embodiment causes the fabrication system to cause interposer chip 802 with its corresponding structures to be oriented relative to J-chip 602 with its corresponding structures to be oriented relative to one another such that their respective structures face each other to form the flip-chip configuration. For example, the interposer chip is shown as flipped over the J-chip such that bumps 914 described in FIG. 9 make physical and electrical contact with structures 604 on the J-chip 602 of FIG. 6.

Figure 11:
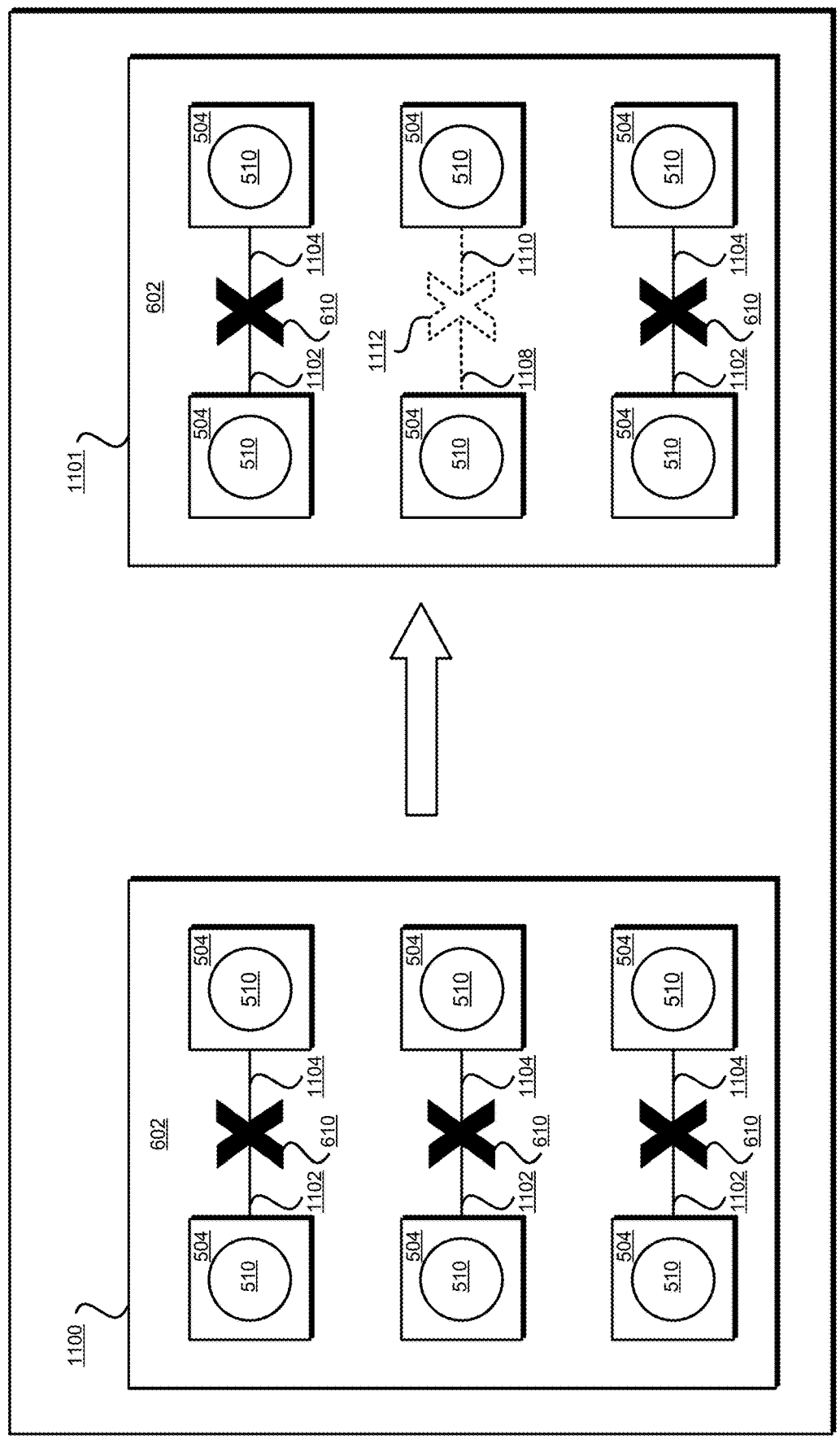
FIG. 11 depicts a top-down schematic view of an example J-chip configuration in accordance with an illustrative embodiment.

With reference to FIG. 11, this figure depicts a top-down schematic view of an example J-chip configuration in accordance with an illustrative embodiment. Application 105 in FIG. 1 interacts with fabrication system 107 to produce or manipulate configuration 1100 to form configuration 1101 as described herein. In configuration 1100 assume that J-chip substrate 602 of FIG. 6 is configured with three non-limiting example Josephson junctions 610. Each Josephson junction 610 is electrically coupled with a corresponding pair of pads 504, and the pairs of pads 504 have UBM layers 510 fabricated in the manner described in FIG. 5.

Only three Josephson junctions and their corresponding pairs of connection structures are shown in the interest of clarity and not to imply any limitation on the illustrative embodiments to configurations of only three or less Josephson junctions on a contemplated J-chip. An embodiment can be implemented and practiced with a J-chip comprising any number of Josephson junctions and their corresponding connection structures without any limitation imposed by the illustrative embodiments, and limited only by the state of the art in the field at any given time.

In an embodiment, application 105 determines a subset of the set of Josephson junctions 610 are to be removed to avoid frequency collision. An embodiment causes the fabrication system to disable the subset of the set of Josephson junctions 610, thus forming configuration 1101, a disabled Josephson junction is represented in configuration 1101 as Josephson junction 1112. A Josephson junction can be disabled in a variety of ways, including but not limited to physically destroying or altering the Josephson junction, electrically destroying or altering an electrical characteristic of the Josephson junction, disconnecting the Josephson junction from the Josephson junction's corresponding one or both pads, physically destroying or altering the Josephson junction's one or both pads, electrically destroying or altering an electrical characteristic of the Josephson junction's one or both pads, physically destroying or altering a UBM layer on one or both pads of the Josephson junction, electrically destroying or altering an electrical characteristic of the UBM layer on one or both pads of the Josephson junction, covering up one or both pads or one or both UBMs of the Josephson junction by fabricating an insulating layer, or some combination of these and many other possible ways of rendering a Josephson junction unusable.

For example, in an embodiment, the fabrication system ablates the subset of the set of Josephson Junctions 1112 from the surface of J-chip substrate 602. For example, the fabrication system can use laser ablation to remove the subset of the set of Josephson Junctions 1112. As another example, the fabrication system can use focused ion beam (FIB) to remove the subset of the set of Josephson Junctions 1112. In another embodiment, the fabrication system destroys the subset of the set of Josephson Junctions 1112 by disconnecting electrical connectors 1108 and 1110 coupling Josephson junction 1112 to its corresponding pair of pads 504. The disconnecting of connectors 1108 and 1110 can also be performed via ablation, FIB, or another suitable method.

Figure 12:
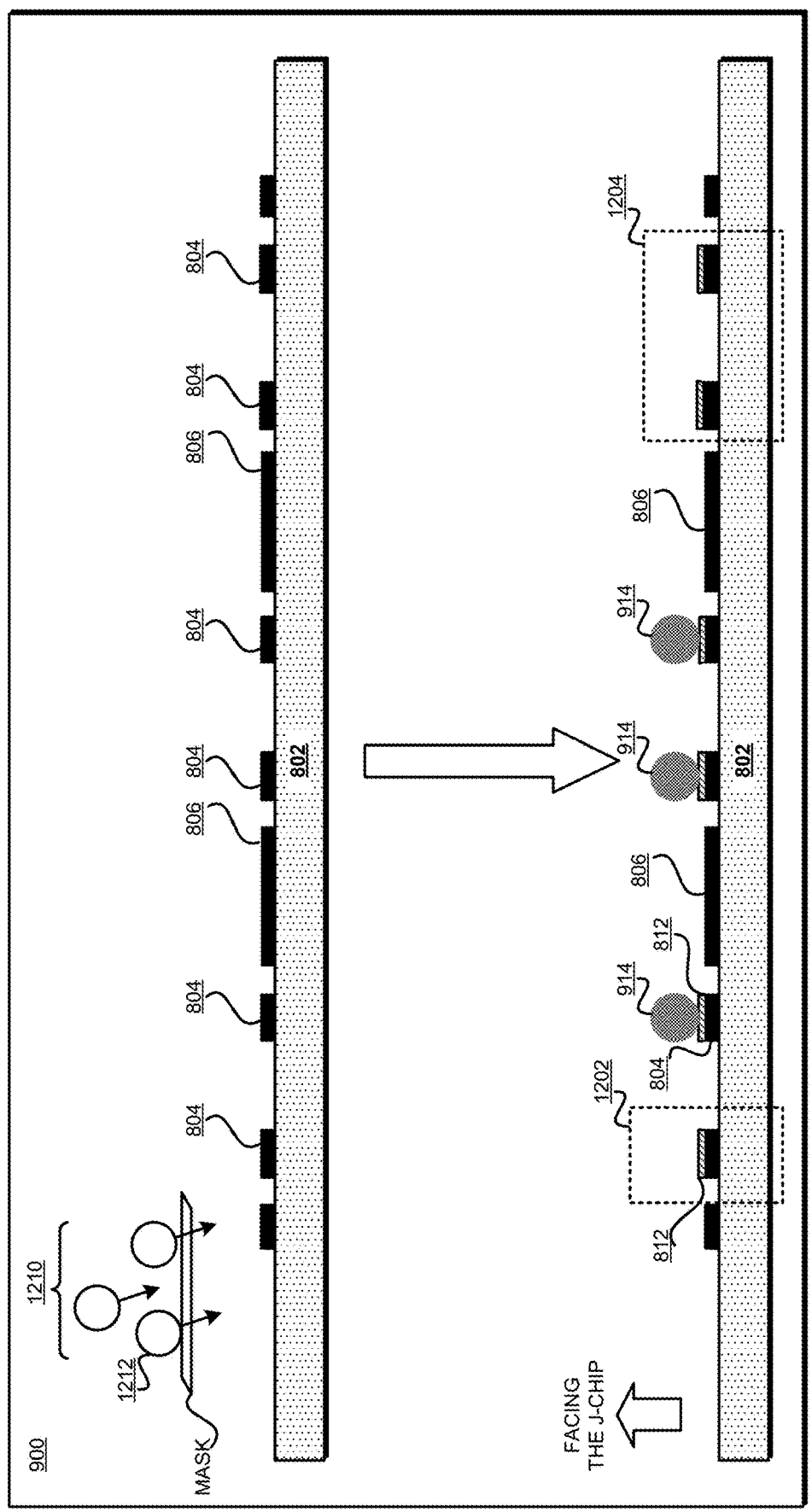
FIG. 12 depicts a block diagram of an alternative example configuration in accordance with an illustrative embodiment.

With reference to FIG. 12, this figure depicts a block diagram of an alternative example configuration in accordance with an illustrative embodiment. Application 105 in FIG. 1 interacts with fabrication system 107 to produce or manipulate configuration 1200 as described herein. Configuration 1200 is an example of configuration 800 in FIG. 8. Configuration 1200 starts with interposer substrate 802, a set of pads 804, a set of resonators 806, and a first layer 812 formed on the set of pads 804.

A Josephson junction can be disabled or rendered unavailable for use in a quantum computing apparatus by simply not connecting to that Josephson junction. For example, an undesirable Josephson junction—along with the Josephson junction's connected pads and UBM layers—can be left unconnected by simply not forming a bump at the location on the interposer chip, where the location corresponds to the UBM layers of the Josephson junction. Absent a bump, a pad on the interposer at the location will not make electrical contact with the UBM layer of the Josephson junction, rendering the Josephson junction unusable.

An embodiment causes a mask to be constructed that certain interposer pads are blocked from receiving material 1212 deposited using process 1210 in the fabrication system. Thus, as can be seen in the example result of such selective depositing, second layer 904 is formed only on some pad-UBM combination 804-812 and not others. For example, a single pad-UBM combination 804-812 in area marked 1202 is devoid of the second layer—the bump. As another example, a pair of pad-UBM combination 804-812 in area marked 1204 is devoid of the bump.

Figure 13:
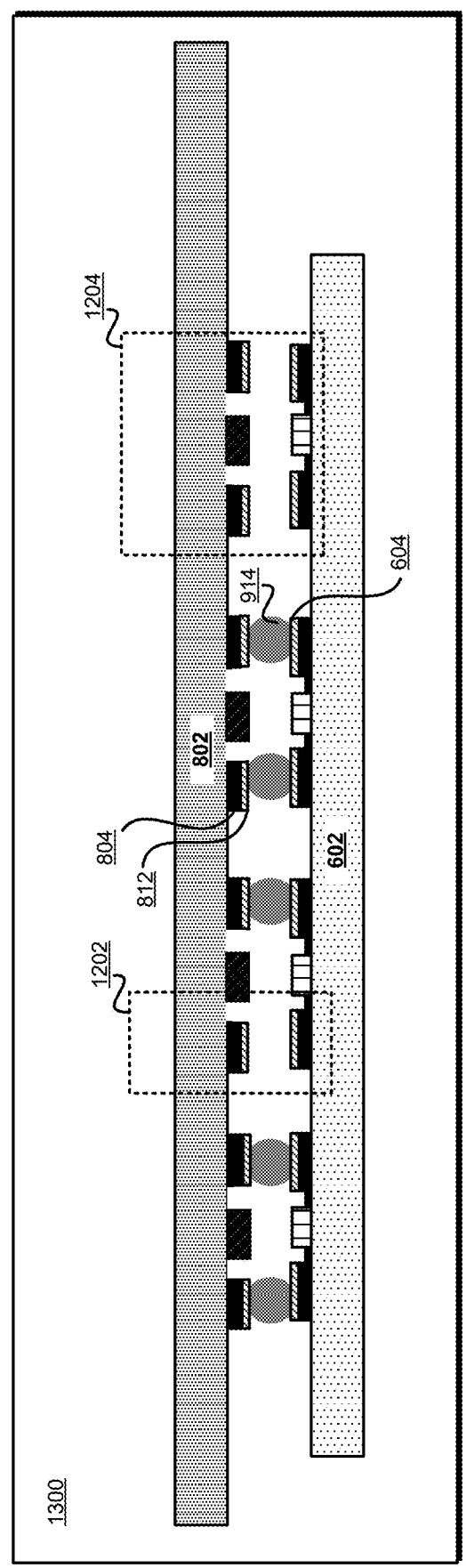
FIG. 13 depicts a block diagram of an example J-chip assembly in accordance with an illustrative embodiment.

With reference to FIG. 13, this figure depicts a block diagram of an example J-chip assembly in accordance with an illustrative embodiment. Assembly 1300 shows, as a non-limiting example, an interposer chip flipped over a J-chip in which some Josephson junctions from the J-chip are connected to circuits and components on the interposer chip and others have been at least left disconnected, and preferably rendered unusable.

Figure 14:
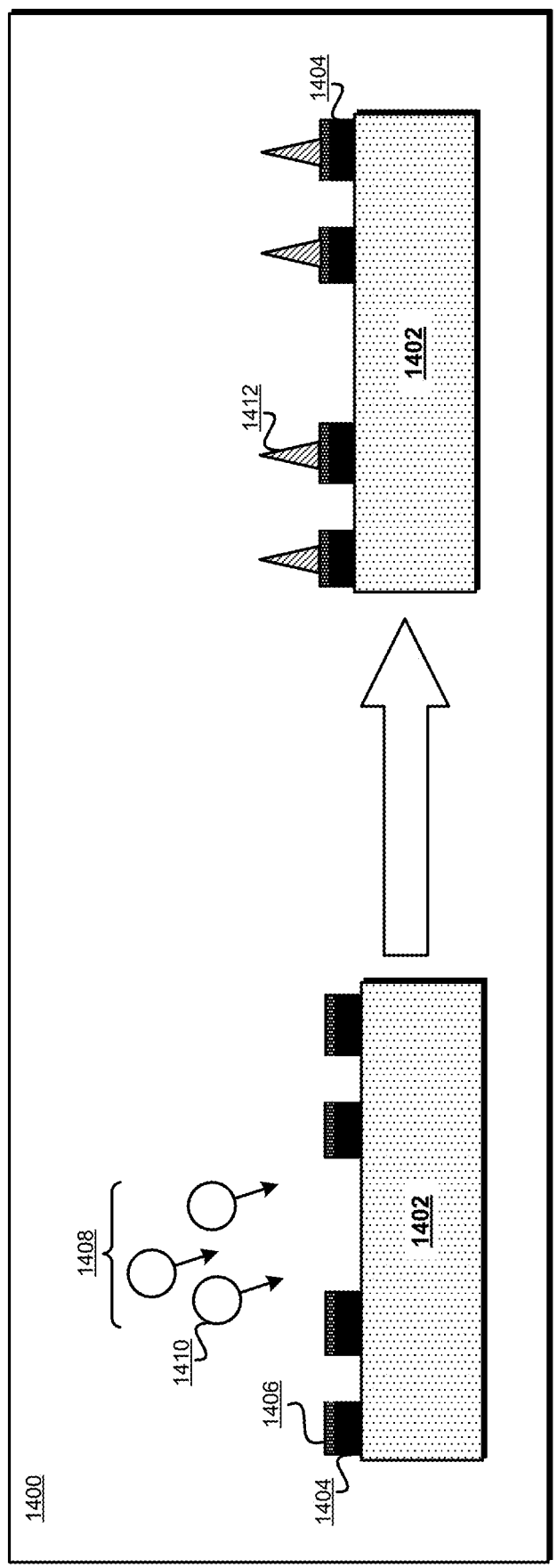
FIG. 14 depicts a block diagram of an example J-chip configuration in accordance with an illustrative embodiment.

With reference to FIG. 14, this figure depicts a block diagram of an example detachable J-chip configuration in accordance with an illustrative embodiment. Application 105 in FIG. 1 interacts with fabrication system 107 to produce or manipulate configuration 1400 as described herein. Configuration 1400 is an example of configuration 500 in FIG. 5.

Configuration 1400 comprises J-chip substrate 1402, similar to substrate 502 in FIG. 5. Pads 1404 are similar to pads 504 in FIG. 5. First layers 1406 are similar to first layers 510 in FIG. 5.

An embodiment causes a fabrication system, such as fabrication system 107 in FIG. 1, to create a set of protrusions 1412 on a first layer 1406 of a set of pads 1404 of substrate 1402. For example, an embodiment can cause mask 1408 in the fabrication system to deposit material 1410, thus forming the set of protrusions 1412. In an embodiment, fabrication system 107 comprises a wire bonder to deposit material 1410 and form protrusion 1412. For example, the wire bonder can form a first half of a ball bond before pulling upwards to deposit the remainder of the protrusion. In an embodiment, protrusion 1412 is a column. For example, protrusion 1412 can have a conical, triangular, cylindrical, or rectangular cross-section.

In an embodiment, protrusion 1412 comprises a material 1410 with a predetermined ductility (above a threshold) at a room temperature range. In an embodiment, protrusion 1412 is formed using a material that exhibits an elongation at break of at least twenty percent at a room temperature range. For example, protrusion 1412 may be formed using gold, platinum, or a gold-coated superconducting material. These examples of protrusion material, qubit substrate material, protrusion shapes, and deposition methods are not intended to be limiting. From this disclosure those of ordinary skill in the art will be able to conceive of many other materials and methods suitable for forming the substrate, J-chip, and protrusions and the same are contemplated within the scope of the illustrative embodiments.

Figure 15:
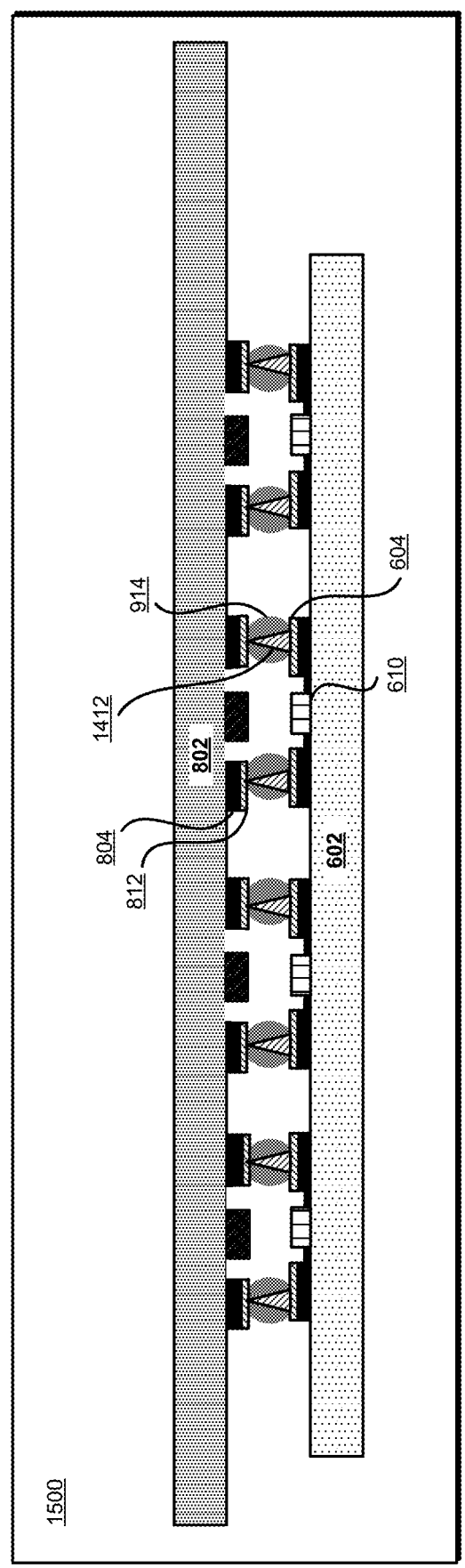
FIG. 15 depicts a block diagram of an example detachable configuration in accordance with an illustrative embodiment.

With reference to FIG. 15, this figure depicts a block diagram of an example detachable configuration in accordance with an illustrative embodiment. Application 105 in FIG. 1 interacts with fabrication system 107 to produce or manipulate configuration 1500 as described herein.

Configuration 1500 comprises an interposer chip configuration built on substrate 802 in the manner of FIG. 9. configuration 1550 further comprises a J-chip configuration built on substrate 602 in the manner of FIG. 6 and further transformed in the manner of FIG. 14.

An embodiment causes the fabrication system to couple the j-chip configuration with the interposer chip configuration such that a protrusion 1412 on the J-chip detachably but conductively couples with a corresponding bump 914 on the interposer chip. Note that a protrusion 1412 may be formed and interfaced with a bump on the interposer even when a corresponding Josephson junction has been disabled in a manner described herein.

In one embodiment, the detachable conductive coupling between protrusion 1412 and bump 914 is achieved by causing fabrication system 107 to cold weld protrusion 1412 with a solder bump 914. For example, protrusion 1412 pierces the corresponding solder bump 914. Cold welding is a welding process in which coupling takes place at the interface of the two parts to be welded, wherein the interface is at a room temperature range. In cold welding, the interface is in a solid state. In this manner, a set of protrusion detachably but electrically conductively couples to a corresponding set of bumps.

Figure 16:
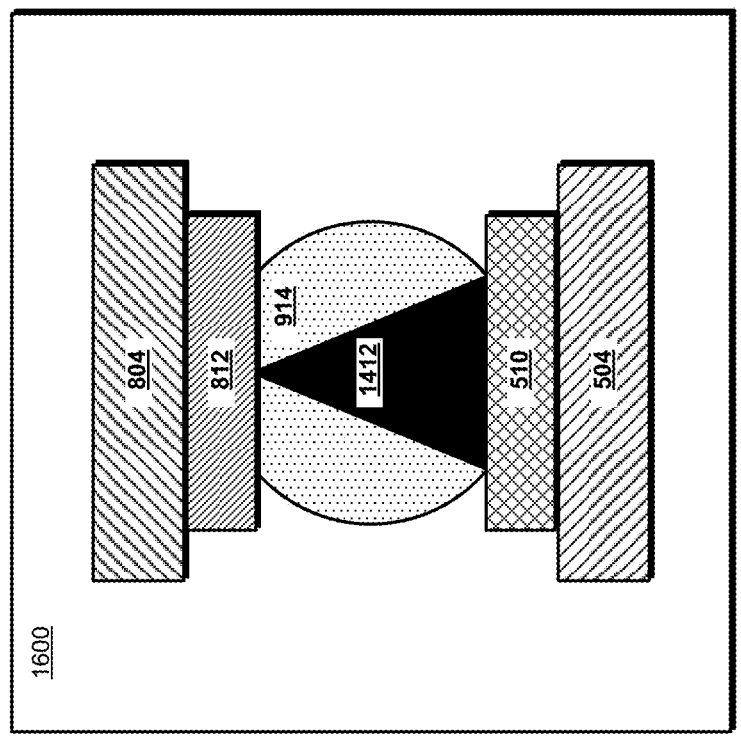
FIG. 16 depicts a block diagram of an example detachable conductive coupling configuration in accordance with an illustrative embodiment.

With reference to FIG. 16, this figure depicts a block diagram of an example detachable conductive coupling configuration in accordance with an illustrative embodiment. Configuration 1600 is an example of the cold-welded connection between the set of protrusions and the set of solder bumps in FIG. 15. Configuration 1600 comprises pad 804 and UBM layer 812 on an interposer chip as in FIG. 8, bump 914 as in FIG. 9, pad 504 and UBM layer 510 on a J-chip as in FIG. 5, and protrusion 1412 as in FIG. 14.

In an embodiment, bump 914 comprises a material with a predetermined ductility (above a threshold) at a room temperature range. In an embodiment, bump 914 is formed using a material that exhibits an elongation at break of at least twenty percent at a room temperature range. For example, bump 914 is formed using at least one of Indium, Tin, Lead, Bismuth, and any combination thereof. In an embodiment, bump 914 comprises a material which exhibits superconductivity in the cryogenic temperature range. In one embodiment, bump 914 contacts UBM layers on the interposer chip as well as on the J-chip. In other words, bump 914 extends fully—and provides a complete electrically conductive path between UBM layers 812 and 510 as shown.

Figure 17:
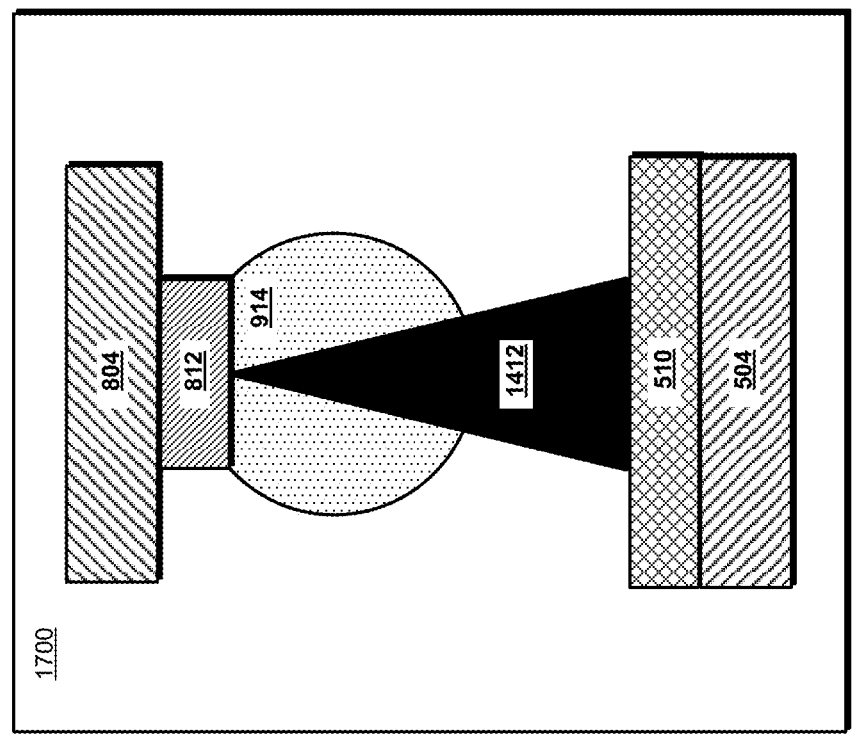
FIG. 17 depicts a block diagram of another example configuration of a detachable conductive coupling in accordance with an illustrative embodiment.

With reference to FIG. 17, this figure depicts a block diagram of another example configuration of a detachable conductive coupling in accordance with an illustrative embodiment. Configuration 1700 is an example of the cold-welded connection between the set of protrusions and the set of solder bumps in FIG. 15. Configuration 1700 comprises pad 804 and UBM layer 812 on an interposer chip as in FIG. 8, bump 914 as in FIG. 9, pad 504 and UBM layer 510 on a J-chip as in FIG. 5, and protrusion 1412 as in FIG. 14.

In an embodiment, bump 914 comprises a material with a predetermined ductility (above a threshold) at a room temperature range. In an embodiment, bump 914 is formed using a material described with respect to FIG. 16. In one embodiment, bump 914 contacts the UBM layer on only one chip but not the other. For example, as shown, bump 914 contacts UBM layer 812 on the interposer chip but not UBM layer 510 on the J-chip. In other words, bump 914 extends partially—and provides a complete electrically conductive path between UBM layers 812 and 510 only when pierced by protrusion 1412, as shown. In an embodiment, a capacitance of the electrical connection is determined by a distance between the first pad 804 and the second pad 504. For example, the capacitance is inversely proportional to a distance, or gap height, between the first pad 804 and the second pad 504. In an embodiment, protrusion 1412 has a height corresponding to a desired capacitance of the electrical connection. In an embodiment, the gap height is a function of the height of the protrusion 1412 and the compression force during cold welding. For example, the gap height can have an inverse relationship with the amount of the compression force during cold welding. As another example, the gap height can have a direct relationship with the height of the protrusion 1412.

These examples of substrate materials, bump materials, deposition methods, and pad materials are not intended to be limiting. From this disclosure those of ordinary skill in the art will be able to conceive of many other materials and deposition methods suitable for forming the components of the device and the same are contemplated within the scope of the illustrative embodiments. In an embodiment, a height of corresponding protrusions differs between a set of protrusions formed on a surface. For example, a height of protrusions can differ to accommodate warpage of a substrate.

Figure 18:
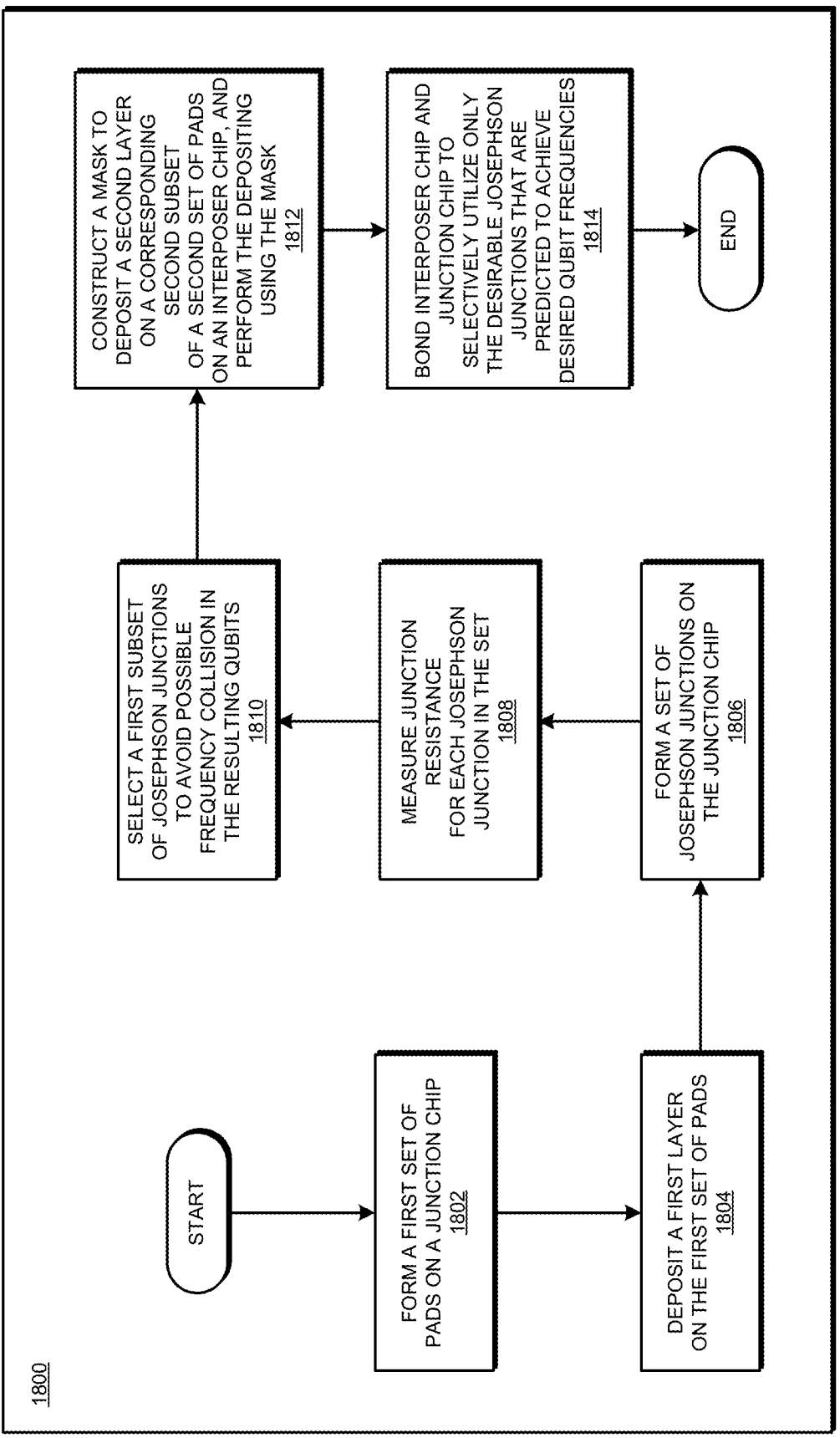
FIG. 18 depicts a flowchart of an example process for fabricating a flip-chip quantum computing device in accordance with an illustrative embodiment.

With reference to FIG. 18, this figure depicts a flowchart of an example process for fabricating a flip-chip quantum computing device in accordance with an illustrative embodiment. In one or more embodiments, process 1800 is implemented in application 105, which causes a fabrication system, such as fabrication system 107 in FIG. 1 to perform the operations described herein.

In block 1802, the application causes the fabrication system to form a first set of pads on a J-chip. In block 1804, the application causes the fabrication system to deposit a first layer on the first set of pads. In block 1806, the application causes the fabrication system to form a set of Josephson junctions on the J-chip, each Josephson junction in the set of Josephson junctions having a junction resistance (slightly inductive impedance).

In block 1808, the application causes the fabrication system to measure a Josephson junction resistance of each of the Josephson junctions in a set of Josephson junctions formed in block 1806, for example, by electrically probing the Josephson junction resistance of each Josephson junction. The application causes the fabrication system to calculate a predicted frequency of each qubit that could be based upon a particular Josephson junction having a measured Josephson junction resistance. In a particular embodiment, the design/fabrication system uses a fitted curve relating Josephson junction resistance to frequency to calculate the predicted frequency of each qubit, such as graph 700 of FIG. 7.

In block 1810, the application causes the fabrication system to select, in response to the calculation, a first subset of the set of Josephson junctions to avoid or mitigate possible frequency collision between qubits that could result from the Josephson junctions in the first subset. In one embodiment, at block 1812, the fabrication system deposits, in response to the selection, a second layer on a second subset of a second set of pads on an interposer chip. In an embodiment, the second subset of the second set of pads corresponds to the selected first subset of the set of Josephson junctions. In practice, the application causes a mask to be constructed that allows only the pads in the second subset to receive a deposited material of the second layer. The application then causes a lithography component of the fabrication system to use the mask in depositing the material of the second layer onto the second subset of pads.

In an embodiment, the application causes the fabrication system to determine a separation gap distance between the interposer chip and the J-chip based upon the selected subset of the set of Josephson junctions, frequency tuning range, and sensitivity. In block 1814, the application causes the fabrication system to bond the interposer chip and J-chip at the determined separation gap distance to achieve the desired qubit frequencies in the flip-chip arrangement. In a particular embodiment, the fabrication system bonds the interposer chip and J-chip using a bump bond process. In other particular embodiments, other suitable methods of permanent or temporary (detachable) bonding the interposer chip and the J-chip may be used. Process 1800 then ends.

Figure 19:
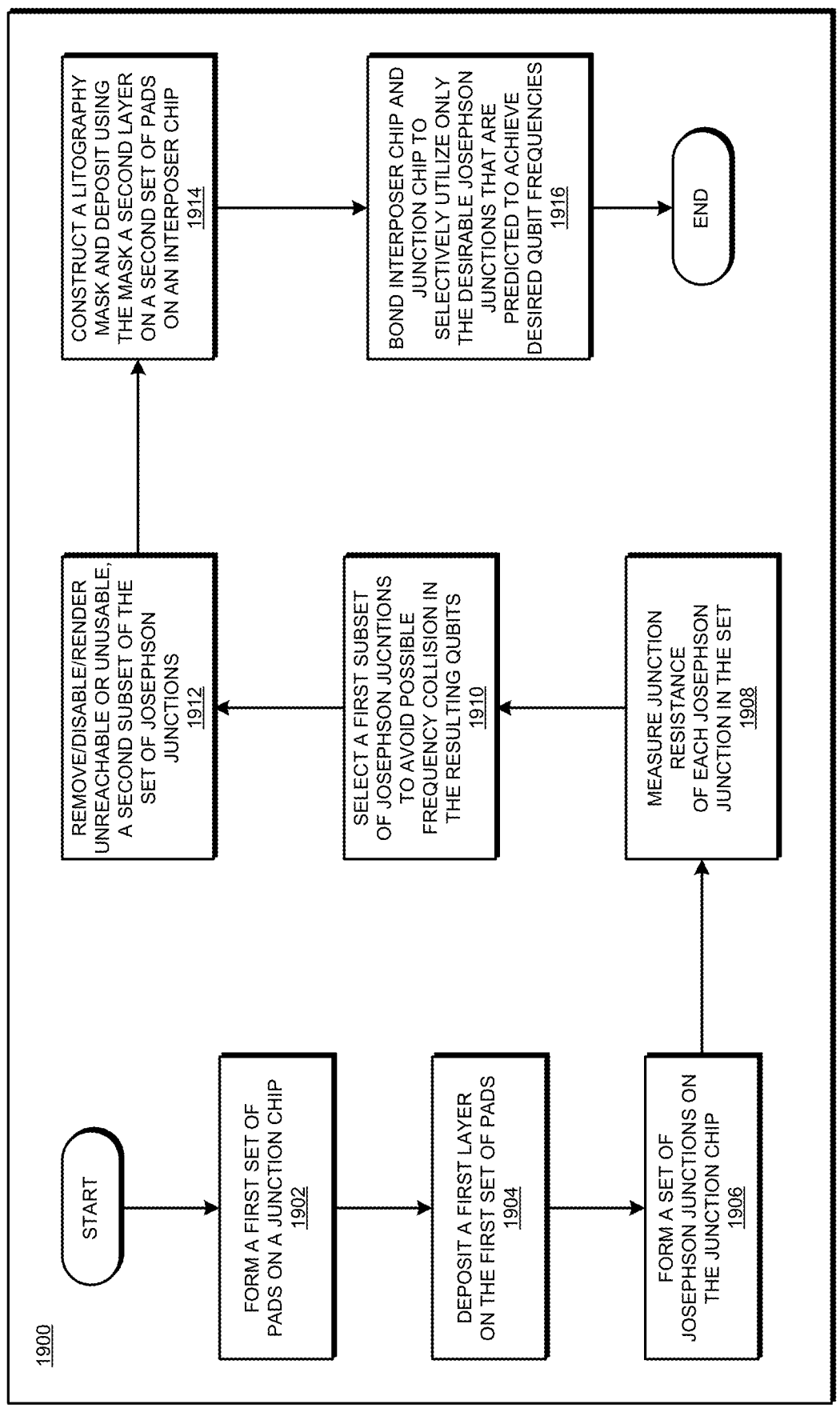
FIG. 19 depicts a flowchart of an example process for fabricating a flip-chip quantum computing device in accordance with an illustrative embodiment.

With reference to FIG. 19, this figure depicts a flowchart of an example process for fabricating a flip-chip quantum computing device in accordance with an illustrative embodiment. In one or more embodiments, process 1800 is implemented in application 105, which causes a fabrication system, such as fabrication system 107 in FIG. 1 to perform the operations described herein.

In block 1902, the application causes the fabrication system to form a first set of pads on a J-chip. In block 1904, the application causes the fabrication system to deposit a first layer on the first set of pads. In block 1906, the application causes the fabrication system to form a set of Josephson junctions on the J-chip, each Josephson junction in the set of Josephson junctions having a junction resistance.

In block 1908, the application causes the fabrication system to measure a Josephson junction resistance of each of the Josephson junctions, for example, by electrically probing the Josephson junction resistance of a Josephson junction. The application causes the fabrication system to calculate a predicted frequency of each qubit based upon the measured Josephson junction resistance. In a particular embodiment, the design/fabrication system uses a fitted curve relating Josephson junction resistance of a particular Josephson junction to frequency, to calculate the predicted frequency of a qubit that would be formed using that Josephson junction, such as graph 700 of FIG. 7.

In block 1910, the application causes the fabrication system to select, in response to the calculation, a first subset of the set of Josephson junctions to avoid possible frequency collision in the resulting qubits. In block 1912, in response to the selection, the application causes the fabrication system to removes, disables, other otherwise renders unreachable or unusable, a second subset of the set of Josephson junctions. In an embodiment, an intersection of the first subset and the second subset is an empty set. In block 1914, the application causes the fabrication system to deposit a second layer on a second set of pads on an interposer chip. In practice, the application causes a mask to be constructed that allows the pads in the second set to receive a deposited material of the second layer. The application then causes a lithography component of the fabrication system to use the mask in depositing the material of the second layer onto the second set of pads.

In an embodiment, the application causes the fabrication system to determine a separation gap distance between the interposer chip and the J-chip based upon the selected subset of the set of Josephson junctions, frequency tuning range, and sensitivity. In block 1916, the fabrication system bonds the interposer chip and J-chip at the determined separation gap distance to achieve the desired qubit frequencies in the flip-chip arrangement. In a particular embodiment, the application causes the fabrication system to bond the interposer chip and J-chip using a bump bond process. In other particular embodiments, other suitable methods of bonding the interposer chip and the J-chip may be used. Process 1900 then ends.

With reference to FIG. 20, this figure depicts a flowchart of an example process for fabricating a flip-chip quantum computing device in accordance with an illustrative embodiment. In one or more embodiments, process 1800 is implemented in application 105, which causes a fabrication system, such as fabrication system 107 in FIG. 1 to perform the operations described herein.

In block 2002, the application causes the fabrication system to form a first set of pads on a J-chip. In block 2004, the application causes the fabrication system to deposit a first layer on the first set of pads. In block 2006, the application causes the fabrication system to deposit a first set of stud bumps (protrusions) on the first layer of the J-chip. In block 2008, the application causes the fabrication system to a set of Josephson junctions on the J-chip, each Josephson junction in the set of Josephson junctions having a junction resistance.

In block 2010, the application causes the fabrication system to measure a Josephson junction resistance of each of the Josephson junctions, for example, by electrically probing the Josephson junction resistance. The application causes the fabrication system to calculate a predicted frequency of each qubit that would result from a Josephson junction in the set, based upon the measured Josephson junction resistance. In a particular embodiment, the design/fabrication system uses a fitted curve relating Josephson junction resistance to frequency to calculate the predicted frequency of each qubit, such as graph 700 of FIG. 7.

In block 2012, the application causes the fabrication system to select, in response to the calculation, a first subset of the set of Josephson junctions to avoid or mitigate possible frequency collision in the qubits resulting from the Josephson junctions in the first subset. In block 2014, in response to the selection, the application causes the fabrication system to remove, disable, or otherwise render unreachable or unusable, a second subset of the set of Josephson junctions. In an embodiment, an intersection of the first subset and the second subset is an empty set. In block 2016, the application causes the fabrication system to deposit, in response to the selection, a second layer on a second set of pads on an interposer chip. In an embodiment, the second subset of the second set of pads corresponds to the selected first subset of the set of qubits. In an embodiment, the fabrication system deposits a second layer on the second set of pads on the interposer chip.

In block 2018, the application causes the fabrication system to form a temporary bond between the interposer chip and the J-chip. In block 2020, the application measures actual frequencies of the set of qubits resulting from the first subset of Josephson junctions, during cryogenic operation. In block 2022, the application determines whether the actual measured frequencies meet a threshold for avoidance of frequency collision.

In block 2026 ("NO" path of block 2022), the fabrication system alters frequencies of one or more qubits in the set of qubits. In one embodiment, fabrication system warms the flip-chip assembly, detaches the interposer chip from the J-chip, performs a laser annealing process to alter the resistance of one or more Josephson junctions in the first subset of Josephson junctions. The process then temporarily bonds the interposer chip with the J-chip in the manner of block 2018 and returns to block 2020.

In block 2024 ("YES" path of block 2022), the application causes the fabrication system to durably bond the interposer chip and J-chip at a determined separation gap distance to achieve the desired qubit frequencies in the flip-chip arrangement. In a particular embodiment, the application causes the fabrication system to durably or permanently bond the interposer chip and J-chip using a bump bond process. In other particular embodiments, other suitable methods of bonding the interposer chip and the J-chip may be used. In an embodiment, the application causes the fabrication system to determine a separation gap distance between the interposer chip and the J-chip based upon the selected subset of the set of Josephson junctions, frequency tuning range, and sensitivity. Process 2000 then ends.

Various embodiments of the present invention are described herein with reference to the related drawings. Alternative embodiments can be devised without departing from the scope of this invention. Although various connections and positional relationships (e.g., top, bottom, over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method to fabricate a quantum computing device, the method comprising:
    forming a first chip having a first substrate, a first set of pads, and a set of Josephson junctions disposed on the first substrate; and
    forming a second chip having a second substrate, a second set of pads disposed on the second substrate opposite the first set of pads,
    wherein the forming of the second chip comprises deposition of connection structures onto a subset of the second set of pads using a mask that blocks deposition onto an unused pad of the second set of pads, the unused pad being associated with a first Josephson junction of the set of Josephson junctions that fails to satisfy a frequency collision separation threshold.

2. The computer-implemented method of claim 1, wherein the blocking of the deposition onto the unused pad results in the first Josephson junction being rendered an unusable Josephson junction.

3. The computer-implemented method of claim 2, wherein the blocking of the deposition onto the unused pad results in a disconnected pad in the first set of pads, wherein the disconnected pad is electrically coupled to the first Josephson junction.

4. The computer-implemented method of claim 2, wherein an electrical property of a second Josephson junction is modified such that the second Josephson junction no longer operates as a Josephson junction.

5. The computer-implemented method of claim 1, wherein the subset is selected based upon a measurement of a parameter associated with each of the set of Josephson junctions.

6. The computer-implemented method of claim 5, wherein the resonance frequency associated with a particular qubit is one member selected from a set of (i) a predicted resonance frequency calculated based upon the measurement of the parameter, and (ii) an actual measured resonance frequency of the particular qubit.

7. The computer-implemented method of claim 5, wherein the parameter includes a resistance associated with a Josephson junction in the set of Josephson junctions.

8. The computer-implemented method of claim 7, wherein the resistance is a normal-state resistance of the Josephson junction.

9. The computer-implemented method of claim 1, further comprising:
    forming a first set of protrusions formed on the first chip, wherein the forming of the connection structures comprises forming a set of bumps formed on a layer of the second chip, the set of bumps formed of a material having above a threshold ductility at a room temperature range, wherein set of bumps are configured to cold weld to the first set of protrusions.

10. The computer-implemented method of claim 9, wherein the first set of protrusions is of at least one member selected from a set comprising Gold and Platinum.

11. The computer-implemented method of claim 9, wherein the set of bumps is of at least one member selected from a set comprising Indium, Tin, Lead, and Bismuth.

12. The computer-implemented method of claim 9, further comprising:
  forming a flip-chip assembly comprising the first chip detachably attached to the second chip using the cold weld, wherein a parameter of a Josephson junction inside the flip-chip assembly is tunable by disassembling the flip-chip assembly at the cold weld.

13. A superconductor fabrication system comprising a lithography component, the superconductor fabrication system when operated on at least one die to fabricate a quantum computing device performing operations comprising:
  forming a first chip having a first substrate, a first set of pads, and a set of Josephson junctions disposed on the first substrate; and
  forming a second chip having a second substrate, a second set of pads disposed on the second substrate opposite the first set of pads,
  wherein the forming of the second chip comprises deposition of connection structures onto a subset of the second set of pads using a mask that blocks deposition onto an unused pad of the second set of pads, the unused pad being associated with a first Josephson junction of the set of Josephson junctions that fails to satisfy a frequency collision separation threshold.

14. The superconductor fabrication system of claim 13, wherein the blocking of the deposition onto the unused pad results in the first Josephson junction being rendered an unusable Josephson junction.

15. The superconductor fabrication system of claim 14, wherein the blocking of the deposition onto the unused pad results in a disconnected pad in the first set of pads, wherein the disconnected first set of pads comprises a pad is electrically coupled to the first Josephson junction.

16. The superconductor fabrication system of claim 14, wherein an electrical property of a second Josephson junction is modified such that the second Josephson junction no longer operates as a Josephson junction.

17. The superconductor fabrication system of claim 13, wherein the subset is selected based upon a measurement of a parameter associated with each of the set of Josephson junctions.

18. The superconductor fabrication system of claim 17, wherein the resonance frequency associated with a particular qubit is one member selected from a set of (i) a predicted resonance frequency calculated based upon the measurement of the parameter, and (ii) an actual measured resonance frequency of the particular qubit.

19. The superconductor fabrication system of claim 17, wherein the parameter includes a resistance associated with a Josephson junction in the set of Josephson junctions.

20. The superconductor fabrication system of claim 19, wherein the resistance is a normal-state resistance of the Josephson junction.

21. The superconductor fabrication system of claim 13, further comprising:
  forming a first set of protrusions formed on the first chip, wherein the forming of the connection structures comprises forming a set of bumps formed on a layer of the second chip, the set of bumps formed of a material having above a threshold ductility at a room temperature range, wherein set of bumps are configured to cold weld to the first set of protrusions.

22. The superconductor fabrication system of claim 21, wherein the first set of protrusions is of at least one member selected from a set comprising Gold and Platinum.

23. The superconductor fabrication system of claim 21, wherein the set of bumps is of at least one member selected from a set comprising Indium, Tin, Lead, and Bismuth.

24. The superconductor fabrication system of claim 21, further comprising:
  forming a flip-chip assembly comprising the first chip detachably attached to the second chip using the cold weld, wherein a parameter of a Josephson junction inside the flip-chip assembly is tunable by disassembling the flip-chip assembly at the cold weld.

25. A computer-implemented method to fabricate a quantum processor, the method comprising:
  forming a set of qubits, at least one qubit in the set of qubits formed in a flip-chip configuration comprising a pair of chips, forming the pair of chips comprising:
    forming a first chip having a first substrate, a first set of pads, and a set of Josephson junctions disposed on the first substrate; and
    forming a second chip having a second substrate, a second set of pads disposed on the second substrate opposite the first set of pads,
  wherein the forming of the second chip comprises deposition of connection structures onto a subset of the second set of pads using a mask that blocks deposition onto an unused pad of the second set of pads, the unused pad being associated with a first Josephson junction of the set of Josephson junctions that fails to satisfy a frequency collision separation threshold.

\* \* \* \* \*